US012512297B2

(12) United States Patent
Matsumoto

(10) Patent No.: US 12,512,297 B2
(45) Date of Patent: Dec. 30, 2025

(54) MULTIPLE CHARGED PARTICLE BEAM WRITING METHOD AND MULTIPLE CHARGED PARTICLE BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 397 days.

(21) Appl. No.: 18/340,152

(22) Filed: Jun. 23, 2023

(65) Prior Publication Data

US 2023/0420217 A1 Dec. 28, 2023

(30) Foreign Application Priority Data

Jun. 28, 2022 (JP) ................................ 2022-103875

(51) Int. Cl.

*H01J 37/317* (2006.01)
*H01J 37/147* (2006.01)
*H01J 37/20* (2006.01)

(52) U.S. Cl.

CPC ........ *H01J 37/3177* (2013.01); *H01J 37/147* (2013.01); *H01J 37/20* (2013.01); *H01J 2237/20285* (2013.01)

(58) Field of Classification Search

CPC .... H01J 37/3177; H01J 37/3026; H01J 37/20; H01J 37/147; H01J 2237/30416; H01J 2237/20228; H01J 2237/20285; H01J 2237/1503; H01J 2237/30483; G03F 7/70391; G03F 7/70191

See application file for complete search history.

(56) References Cited

U.S. PATENT DOCUMENTS 10,109,458 B2 10/2018 Iizuka
11,227,744 B2 1/2022 Matsumoto
2018/0031498 A1* 2/2018 Shiratsuchi ........ G01N 23/2251
2021/0013003 A1* 1/2021 Matsumoto ......... H01J 37/3026

FOREIGN PATENT DOCUMENTS

JP 2017-220615 A 12/2017
KR 10-2021-0007847 A 1/2021

* cited by examiner

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

A multiple charged particle beam writing method according to one aspect of the present invention includes performing writing, during writing in the k-th (k being an integer of at least one) stripe region, in the k-th extended region, which is obtained by extending the irradiation region in the first direction by a predetermined extension width, while deflecting multiple charged particle beams and moving the multiple charged particle beams in the second direction, and performing writing, during writing in the (k+1)th stripe region, in the (k+1)th extended region, which is obtained by extending the irradiation region in the first direction by the extension width, while deflecting the multiple charged particle beams and moving the multiple charged particle beams in the second direction.

10 Claims, 20 Drawing Sheets

$X = Axx \cdot x + Axy \cdot y$
$Y = Ayx \cdot x + Ayy \cdot y$

SHOT 1
&
TRACKING RESET

SHOT 2
&
TRACKING RESET
&
y DEFLECTION

SHOT 3
&
TRACKING RESET

SHOT 4
&
TRACKING RESET
&
y DEFLECTION RESET

SHOT 5
&
TRACKING RESET
34
37
32

SHOT 6
&
TRACKING RESET
&
y DEFLECTION
34
37
32
y
x

SHOT 8
&
TRACKING RESET
&
y DEFLECTION
RESET
34
37
32

SHOT 1
&
TRACKING RESET
&
Y DEFLECTION

SHOT 2
&
TRACKING RESET

SHOT 3
&
TRACKING RESET
&
y DEFLECTION RESET

SHOT 4
&
TRACKING RESET

SHOT 5
&
TRACKING RESET
&
y DEFLECTION

SHOT 8
&
TRACKING RESET

SHOT 1

SHOT 2

SHOT 4
&
TRACKING RESET

MULTIPLE CHARGED PARTICLE BEAM WRITING METHOD AND MULTIPLE CHARGED PARTICLE BEAM WRITING APPARATUS

CROSS-REFERENCE TO RELATED APPLICATION

This application is based upon and claims the benefit of priority from prior Japanese Patent Application No. 2022-103875 filed on Jun. 28, 2022 in Japan, the entire contents of which are incorporated herein by reference.

BACKGROUND OF THE INVENTION

Field of the Invention

Embodiments of the present invention relate to a multiple charged particle beam writing method and a multiple charged particle beam writing apparatus, and, for example, to a method for correcting a positional deviation (shift) of a beam array occurring on the substrate surface of a multiple beam writing apparatus.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" patterns on a wafer and the like with electron beams.

For example, as a known example of employing the electron beam writing technique, there is a writing apparatus using multiple beams. Since it is possible for multiple beam writing to apply multiple beams at a time, the writing throughput can be greatly increased in comparison with single electron beam writing. For example, a writing apparatus employing the multiple beam system forms multiple beams by letting portions of an electron beam emitted from an electron gun individually pass through a corresponding one of a plurality of holes in a mask, performs blanking control for each beam, reduces each unblocked beam by an optical system, and deflects it by a deflector to irradiate a desired position on a target object or "sample".

In multiple beam writing, it is important for the writing accuracy to highly accurately connect beam arrays which are to be applied to a substrate. Therefore, mark scanning is performed before writing in order to measure a beam array shape on the substrate (e.g., refer to JP 2017-220615 A). As for linear components of a beam array shape, the YY linear component indicating a displacement in the y direction and the XY linear component indicating an oblique displacement, which is shifted in the x direction while maintaining the y direction, can enhance the averaging effect by increasing the number of passes of multiple writing (multiplicity) performed while shifting the irradiation region in the y direction. However, in order to prevent an increase in the writing time, it becomes necessary to raise the stage speed in response to the increase in the number of passes.

BRIEF SUMMARY OF THE INVENTION

According to one aspect of the present invention, a multiple charged particle beam writing method includes performing writing in each stripe region, which is obtained by dividing a writing region on a surface of a target object by a predetermined size width in a first direction, while deflecting multiple charged particle beams within an irradiation region of the multiple charged particle beams, a design region width in the first direction of the irradiation region being the predetermined size, and moving the irradiation region in a second direction orthogonal to the first direction;

performing writing, during writing in a k-th (k being an integer of at least one) stripe region, in a k-th extended region, which is obtained by extending the irradiation region in the first direction by a predetermined extension width, while deflecting the multiple charged particle beams and moving the multiple charged particle beams in the second direction;

performing writing in a (k+1)th stripe region which has been shifted in the first direction from the k-th stripe region by a displacement amount different from the extension width in a manner such that a part of the (k+1)th stripe region is overlapped with the k-th stripe region; and performing writing, during writing in the (k+1)th stripe region, in a (k+1)th extended region, which is obtained by extending the irradiation region in the first direction by the extension width, while deflecting the multiple charged particle beams and moving the multiple charged particle beams in the second direction.

According to another aspect of the present invention, a multiple charged particle beam writing apparatus includes a writing mechanism configured to include a stage on which a target object is placed and a deflector which deflects multiple charged particle beams, and to write a pattern on the target object with the multiple charged particle beams; and a writing control circuit configured to control a writing operation by the writing mechanism, wherein the writing control circuit controls to perform writing in each stripe region, which is obtained by dividing a writing region on a surface of the target object by a predetermined size width in a first direction, while deflecting the multiple charged particle beams within an irradiation region of the multiple charged particle beams, a design region width in the first direction of the irradiation region being a predetermined size, and moving the irradiation region in a second direction orthogonal to the first direction, controls to perform writing, during writing in a k-th (k being an integer of at least one) stripe region, in a k-th extended region, which is obtained by extending the irradiation region in the first direction by the predetermined extension width, while deflecting the multiple charged particle beams and moving the multiple charged particle beams in the second direction, controls to perform writing in a (k+1)th stripe region which has been shifted in the first direction from the k-th stripe region by a displacement amount different from the extension width in a manner such that a part of the (k+1)th stripe region is overlapped with the k-th stripe region, and controls to perform writing, during writing in the (k+1)th stripe region, in a (k+1)th extended region, which is obtained by extending the irradiation region in the first direction by the extension width, while deflecting the multiple charged particle beams and moving the multiple charged particle beams in the second direction.

DETAILED DESCRIPTION OF THE INVENTION

The embodiments below provide a method and a writing apparatus that can further reduce a positional deviation due to displacement of a linear component of a beam array shape in multiple beam writing compared with a reduction by an averaging effect based on the number of passes of multiple writing.

The embodiments below describe a configuration in which electron beams are used as an example of charged particle beams. The charged particle beam is not limited to the electron beam, and other charged particle beam such as an ion beam may also be used. In addition, in what is described below, rectangles include squares.

First Embodiment

Figure 1:
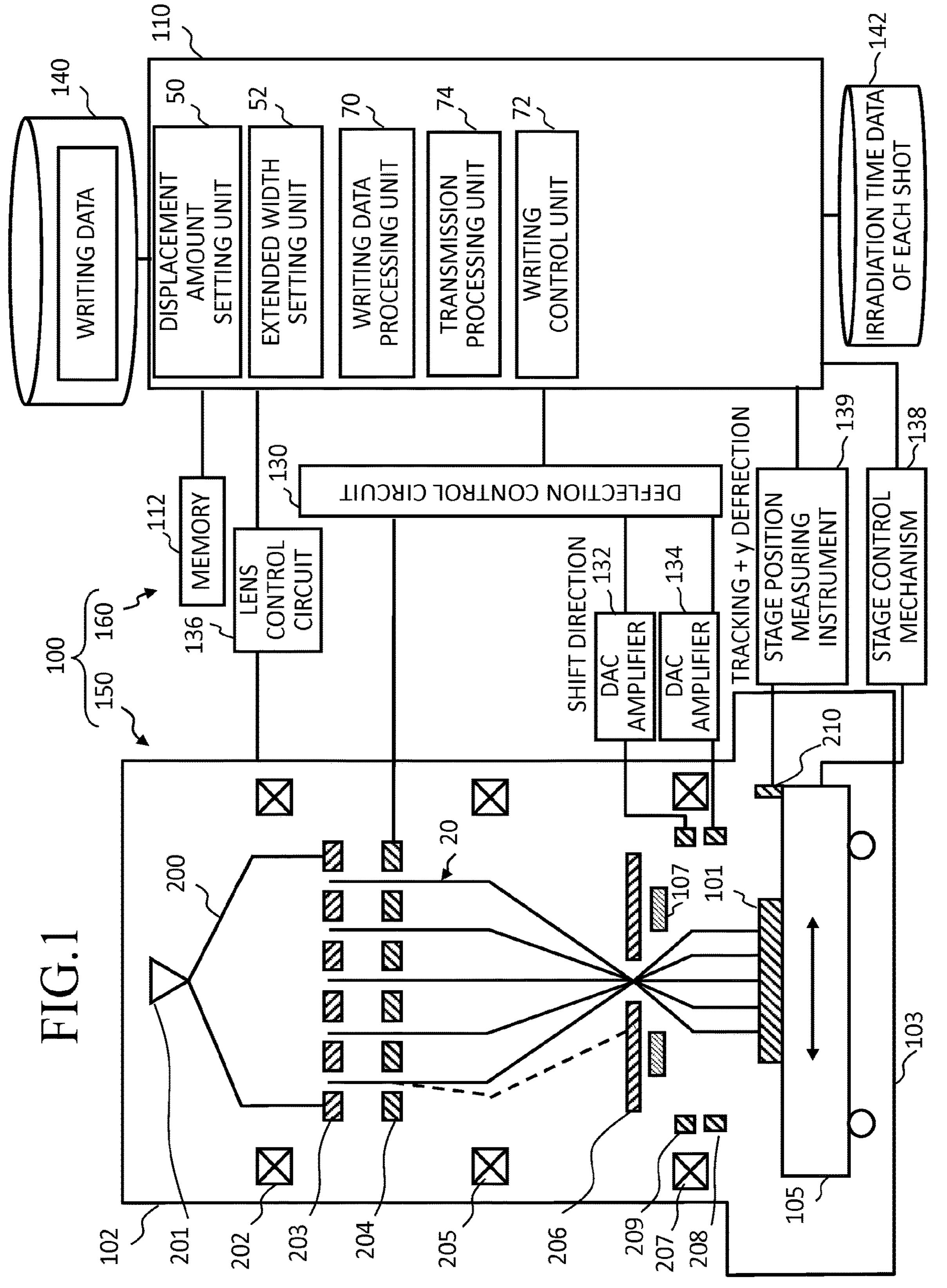
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multiple charged particle beam writing apparatus, and a multiple charged particle beam exposure apparatus. The writing mechanism 150 includes an electron optical column 102 (electron beam column) and a writing chamber 103. In the electron optical column 102, there are disposed an electron gun 201, an illumination lens 202, a shaping aperture array substrate 203, a blanking aperture array mechanism 204, a reducing lens 205, a limiting aperture substrate 206, an objective lens 207, a main deflector 208, and a sub deflector 209.

In the writing chamber 103, an XY stage 105 is disposed. On the XY stage 105, there is placed a target object or "sample" 101 such as a mask serving as a writing target substrate when writing (exposure) is performed. The target object 101 is, for example, an exposure mask used when fabricating semiconductor devices, or a semiconductor substrate (silicon wafer) for fabricating semiconductor devices. Moreover, the target object 101 may be, for example, a mask blank on which resist has been applied and nothing has yet been written. Further, on the XY stage 105, a mirror 210 for measuring the position of the XY stage 105 is placed.

The control system circuit 160 includes a control computer 110, a memory 112, a deflection control circuit 130, DAC (digital-analog converter) amplifier units 132 and 134, a lens control circuit 136, a stage control mechanism 138, a stage position measuring instrument 139, and storage devices 140 and 142 such as magnetic disk drives. The control computer 110, the memory 112, the deflection control circuit 130, the lens control circuit 136, the stage control mechanism 138, the stage position measuring instrument 139, and the storage devices 140 and 142 are connected to each other through a bus (not shown). The DAC amplifier units 132 and 134 and the blanking aperture array mechanism 204 are connected to the deflection control circuit 130. The sub deflector 209 is composed of at least four electrodes (or "at least four poles"), and controlled by the deflection control circuit 130 through the DAC amplifier unit 132 disposed for each electrode. The main deflector 208 is composed of at least four electrodes (or "at least four poles"), and controlled by the deflection control circuit 130 through the DAC amplifier unit 134 disposed for each electrode. Lenses such as the illumination lens 202, the reducing lens 205, and the objective lens 207 are controlled by the lens control circuit 136. The position of the XY stage 105 is controlled by the drive of each axis motor (not shown) which is controlled by the stage control mechanism 138. Based on the principle of laser interferometry, the stage position measuring instrument 139 measures the position of the XY stage 105 by receiving a reflected light from the mirror 210.

In the control computer 110, there are arranged a displacement (shift) amount setting unit 50, an extension width setting unit 52, a writing data processing unit 70, a writing control unit 72, and a transmission processing unit 74. Each of the " . . . units" such as the displacement amount setting unit 50, the extension width setting unit 52, the writing data processing unit 70, the writing control unit 72, and the transmission processing unit 74 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the displacement amount setting unit 50, the extension width setting unit 52, the writing data processing unit 70, the writing control unit 72, and the transmission processing unit 74, and information being operated are stored in the memory 112 each time.

Writing operations of the writing apparatus 100 are controlled by the writing control unit 72. Processing of transmitting irradiation time data of each shot to the deflection control circuit 130 is controlled by the transmission control unit 74.

Writing data (chip data) is input from the outside of the writing apparatus 100, and stored in the storage device 140. Chip data defines information on a plurality of figure patterns which configure a chip pattern. Specifically, for example, a figure code, coordinates, a size, and the like are defined for each figure pattern.

FIG. 1 shows a configuration necessary for describing the first embodiment. Other configuration elements generally necessary for the writing apparatus 100 may also be included therein.

Figure 2:
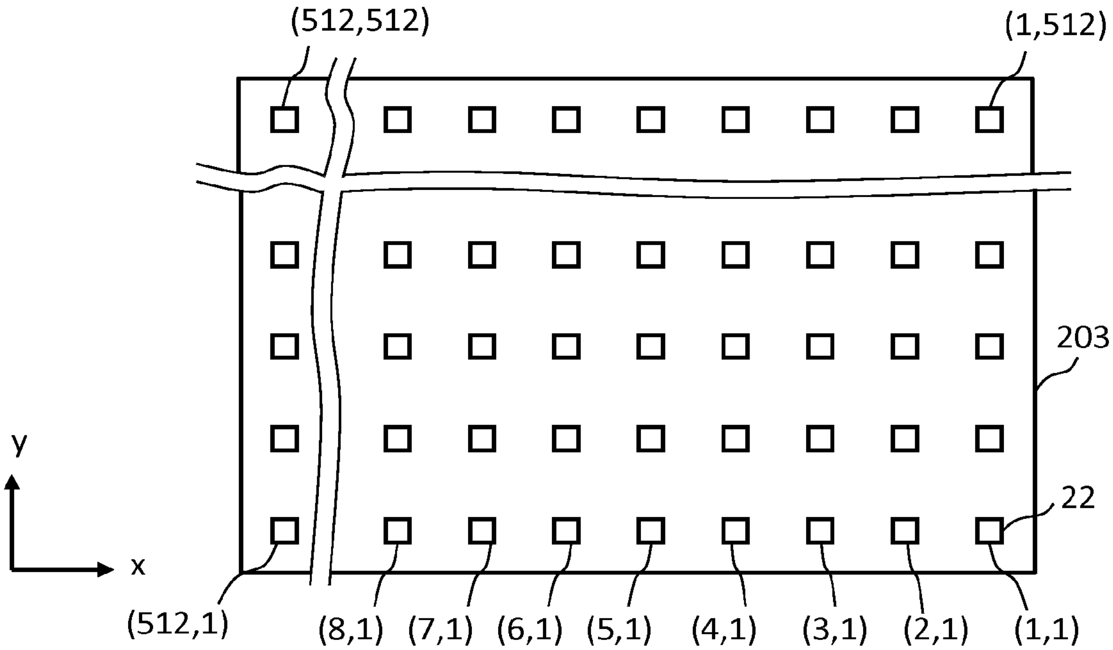
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) ($p \geq 2$, $q \geq 2$) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. The number of holes 22 is not limited thereto. For example, it is also preferable to form the holes 22 of 32×32. Each of the holes 22 is a rectangle having the same dimension and shape as each other. Alternatively, each of the holes 22 may be a circle with the same diameter as each other. Multiple beams 20 are formed by letting portions of an electron beam 200 individually pass through a corresponding one of a plurality of holes 22. In other words, the shaping aperture array substrate 203 forms the multiple beams 20.

Figure 3:
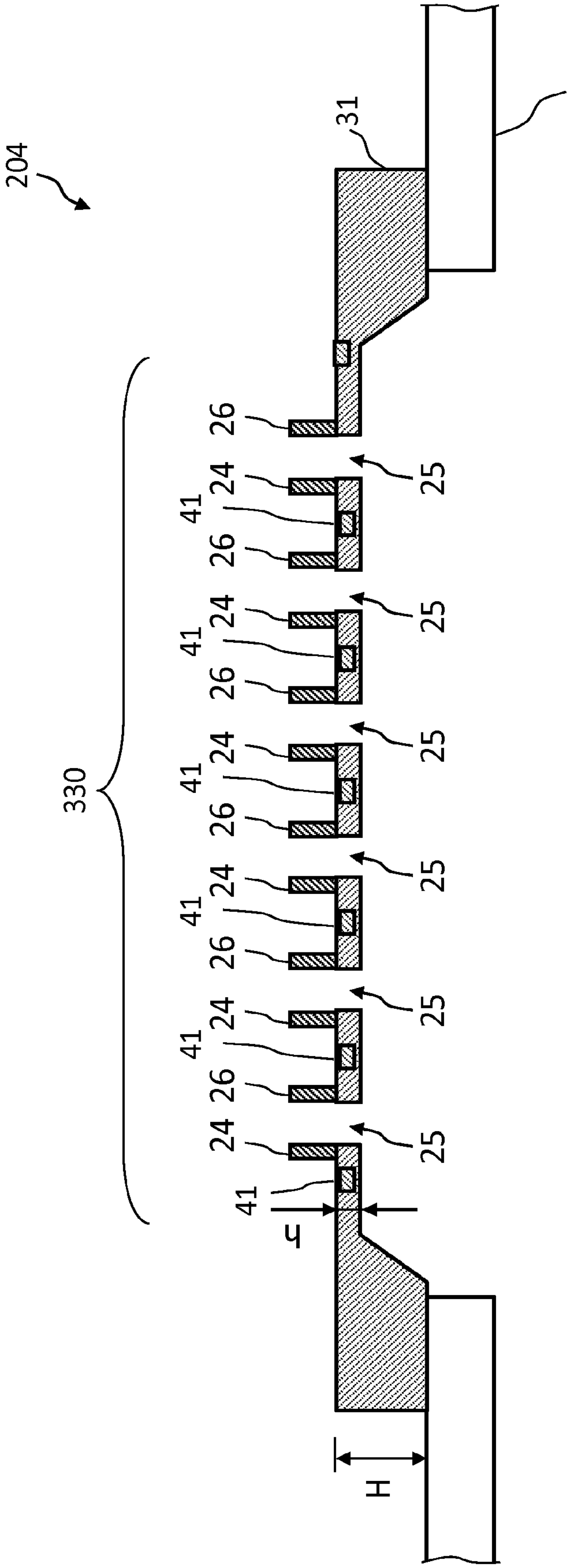
FIG. 3 is a sectional diagram showing a structure of a blanking aperture array mechanism according to the first embodiment.

FIG. 3 is a sectional diagram showing a structure of a blanking aperture array mechanism according to the first embodiment. In the blanking aperture array mechanism 204, a blanking aperture array substrate 31 using a semiconductor substrate made of silicon, etc. is disposed on a support table 33 as shown in FIG. 3. In a membrane region 330 at the center of the blanking aperture array substrate 31, passage holes 25 (openings), through each of which a corresponding one of the multiple beams 20 passes, are formed at positions each corresponding to each hole 22 in the shaping aperture array substrate 203 shown in FIG. 2. A pair of a control electrode 24 and a counter electrode 26, (blanker: blanking deflector), is arranged in a manner such that the electrodes 24 and 26 are opposite to each other across a corresponding one of the plurality of the passage holes 25. A control circuit 41 (logic circuit) which applies a deflection voltage to the control electrode 24 for the passage hole 25 concerned is disposed inside the blanking aperture array substrate 31 and close to each corresponding passage hole 25. The counter electrode 26 for each beam is grounded.

In the control circuit 41, an amplifier (not shown) (an example of a switching circuit) is arranged. A CMOS (Complementary MOS) inverter circuit, being an example of the amplifier, is disposed to be a switching circuit. In regard to the input (IN) to the CMOS inverter circuit, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the CMOS inverter circuit, the output (OUT) of the CMOS inverter circuit, which is to be applied to the control circuit 41, becomes a positive potential (Vdd), and then, a corresponding beam is deflected by an electric field due to a potential difference from the ground potential of the counter electrode 26, and controlled to be in a beam OFF condition by being blocked by the limiting aperture substrate 206. In contrast, in a state (active state) where an H potential is applied to the input (IN) of the CMOS inverter circuit, the output (OUT) of the CMOS inverter circuit becomes a ground potential, and therefore, since there is no potential difference from the ground potential of the counter electrode 26, a corresponding beam is not deflected, and is controlled to be in a beam ON condition by passing through the limiting aperture substrate 206. Blanking control is provided by such deflection.

Next, operations of the writing mechanism 150 will be described. The electron beam 200 emitted from the electron gun 201 (emission source) almost perpendicularly (e.g., vertically) illuminates the whole of the shaping aperture array substrate 203 by the illumination lens 202. A plurality of rectangular holes 22 (openings) are formed in the shaping aperture array substrate 203. The region including all of the plurality of holes 22 is irradiated with the electron beam 200. For example, rectangular multiple beams (a plurality of electron beams) 20 are formed by letting portions of the electron beam 200 applied to the positions of the plurality of holes 22 individually pass through a corresponding one of the plurality of holes 22 in the shaping aperture array substrate 203. The multiple beams 20 individually pass through corresponding blankers of the blanking aperture array mechanism 204. The blanker provides blanking control such that a corresponding beam individually passing becomes in an ON condition during a set writing time (irradiation time).

The multiple beams 20 having passed through the blanking aperture array mechanism 204 are reduced by the reducing lens 205, and travel toward the hole in the center of the limiting aperture substrate 206. Then, the electron beam which was deflected by the blanker of the blanking aperture array mechanism 204 deviates (shifts) from the hole in the center of the limiting aperture substrate 206 and is blocked by the limiting aperture substrate 206. In contrast, the electron beam which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be in the OFF state by the blanker of the blanking aperture array mechanism 204. Then, one shot of each beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, all of the multiple beams 20 having passed through the limiting aperture substrate 206 are collectively deflected in the same direction by the main deflector 208 and the sub deflector 209 in order to irradiate respective beam irradiation positions on the target object 101. When, for example, the XY stage 105 is continuously moving, tracking control is performed by the main deflector 208 so that the beam irradiation position may follow the movement of the XY stage 105. Ideally, the multiple beams 20 irradiating at a time are aligned at the pitch obtained by multiplying the arrangement pitch of a plurality of holes 22 in the shaping aperture array substrate 203 by the desired reduction ratio described above.

Figure 4:
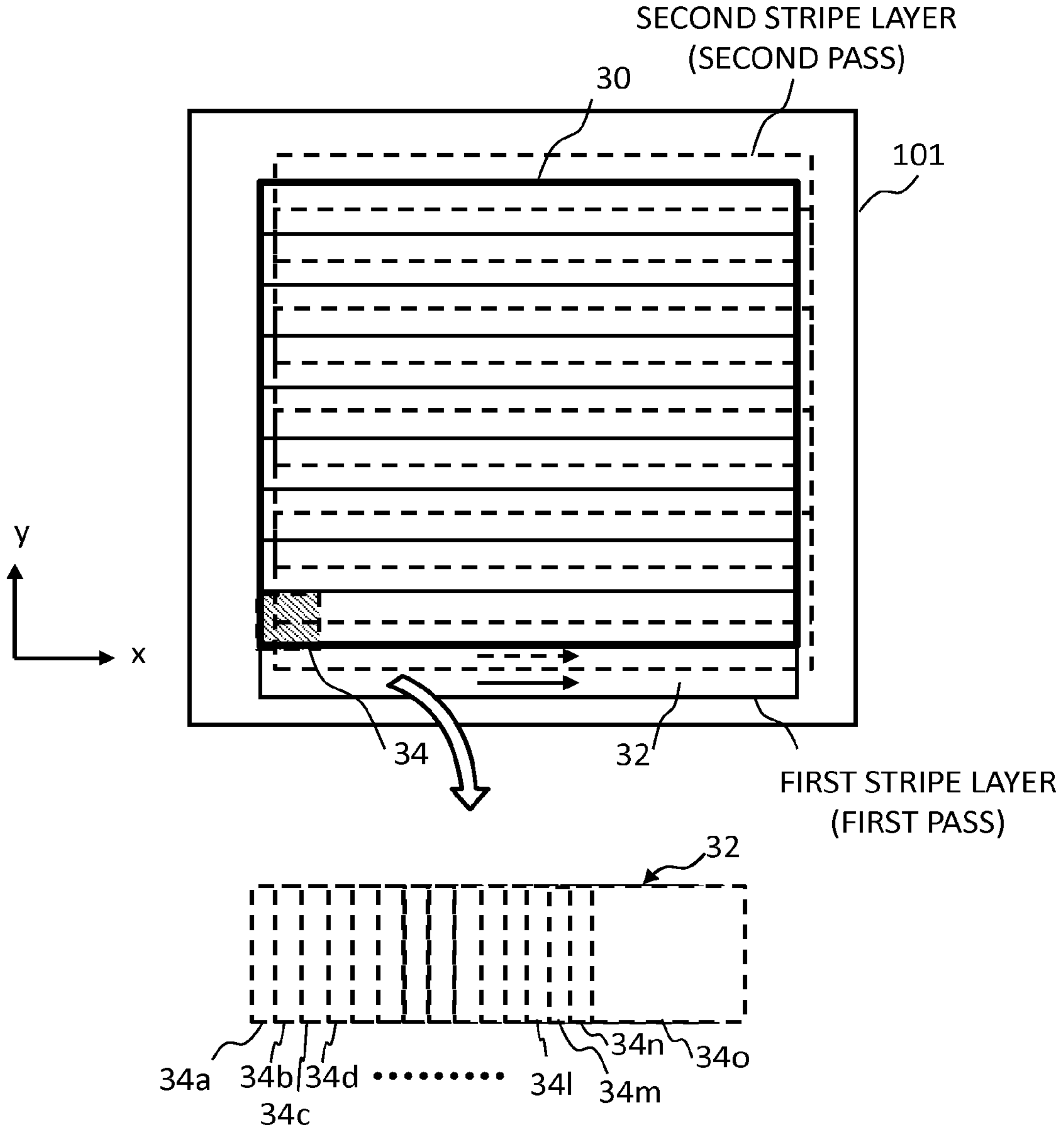
FIG. 4 is a conceptual diagram showing an example of a writing operation according to the first embodiment.

FIG. 4 is a conceptual diagram showing an example of a writing operation according to the first embodiment. As shown in FIG. 4, a writing region 30 (bold line) of the target object 101 is virtually divided into a plurality of stripe regions 32 by a predetermined width in the y direction, for example. In the case of FIG. 4, the writing region 30 of the target object 101 is divided into the plurality of stripe regions 32 by the width size being substantially the same as the design size of an irradiation region 34 (writing field) which can be irradiated by one irradiation with the multiple beams 20. The x-direction design size of the irradiation region 34 of the multiple beams 20 can be defined by (the number of x-direction beams)×(x-direction beam pitch). The y-direction size of the rectangular irradiation region 34 can be defined by (the number of y-direction beams)×(y-direction beam pitch). The irradiation region in design is applied not only in the case where all of the beam arrays are used for writing but also in the case where some beam arrays are used for writing.

Here, a0001s will be described later, according to the first embodiment, a Y deflection of shifting the irradiation region 34 of the multiple beams 20 in the y direction is performed while executing writing in each stripe region 32. Accordingly, in the state where the Y deflection has been performed, there occurs a portion remaining without being written in a region close to the end of the stripe region 32 which is in the opposite direction to the deflection direction. Thus, in order to write this portion, it is preferable, with respect to the first stripe layer, to set one superfluous stripe region 32 in the −y direction from the end of the writing region 30 as shown in FIG. 4. Thereby, the portion remaining without being written in the Y deflection state can be written while executing writing in the one superfluous stripe region 32 set in the −y direction.

FIG. 4 shows the case where multiple writing is performed while displacing (shifting) the position in the y direction by a displacement amount being ½ of the width of the stripe region 32. In that case, the shift multiplicity N in the y direction is N=2. Therefore, the second stripe layer is set to be shifted in the y direction from the first stripe layer by the displacement amount of ½ of the width of the stripe region 32. Thus, in the example of FIG. 4, two stripe layers of the first stripe layer and the second stripe layer are set. Hereinafter, an example of the writing operation will be described.

First, the XY stage 105 is moved to make an adjustment such that the irradiation region 34 of the multiple beams 20 is located at the left end, or at a position further left than the left end, of the first stripe region 32 of the first stripe layer, and then writing (the first pass of multiple writing) of the first stripe region 32 of the first stripe layer is started. When writing the first stripe region 32 of the first stripe layer, the XY stage 105 is moved, for example, in the −x direction, so that the writing may relatively proceed in the x direction. The XY stage 105 is moved, for example, continuously at a constant speed. After writing the first stripe region 32 of the first stripe layer, the stage position is moved in the −y direction by the displacement amount being ½ of the width of the stripe region 32. Thereby, the stripe region 32 to be written is shifted in the y direction by the displacement amount of ½ of the width of the stripe region 32.

Next, an adjustment is made so that the irradiation region 34 of the multiple beams 20 can be located at the left end, or at a position further left than the left end, of the first stripe region 32 of the second stripe layer. Then, writing (second pass of multiple writing) of the first stripe region 32 of the second stripe layer is performed by moving the XY stage 105, for example, in the −x direction to proceed the writing relatively in the x direction. Thus, by alternately writing the stripe region 32 of the first stripe layer and the stripe region 32 of the second stripe layer while shifting the stripe region 32 to be written, in the y direction, by the displacement amount of ½ of the width of the stripe region 32, it becomes possible to perform multiple writing twice each time in the y direction.

The Y deflection which shifts the irradiation region 34 of the multiple beams 20 in the y direction while performing writing in each stripe region 32 will be described later. It is also preferable to further perform multiple writing when writing is advanced in the x direction.

FIG. 4 shows the case where respective stripe regions 32 are written in the same direction, but, however, it is not limited thereto. For example, with respect to the stripe region 32 to be written following the stripe region 32 having been written in the x direction, it may be written in the −x direction by moving the XY stage 105 in the x direction, for example. Thus, the stage moving time can be reduced by performing writing while alternately changing the writing direction. A plurality of shot patterns maximally up to as many as the number of the holes 22 are formed at a time by one shot of multiple beams having been formed by individually passing through the holes 22 in the shaping aperture array substrate 203.

Although FIG. 4 shows the case where multiple writing is performed twice each time in the y direction by writing the stripe region 32 of each stripe layer while shifting the position in the y direction by the displacement amount of ½ of the width of the stripe region 32, it is not limited thereto. For example, it is also preferable to perform multiple writing while shifting the position in the y direction by the displacement amount of ¼ of the width of the stripe region 32. In that case, the shift multiplicity N in the y direction is N=4. Other displacement amounts may be accepted. The shift multiplicity in the y direction is set in accordance with the displacement amount.

Figure 5:
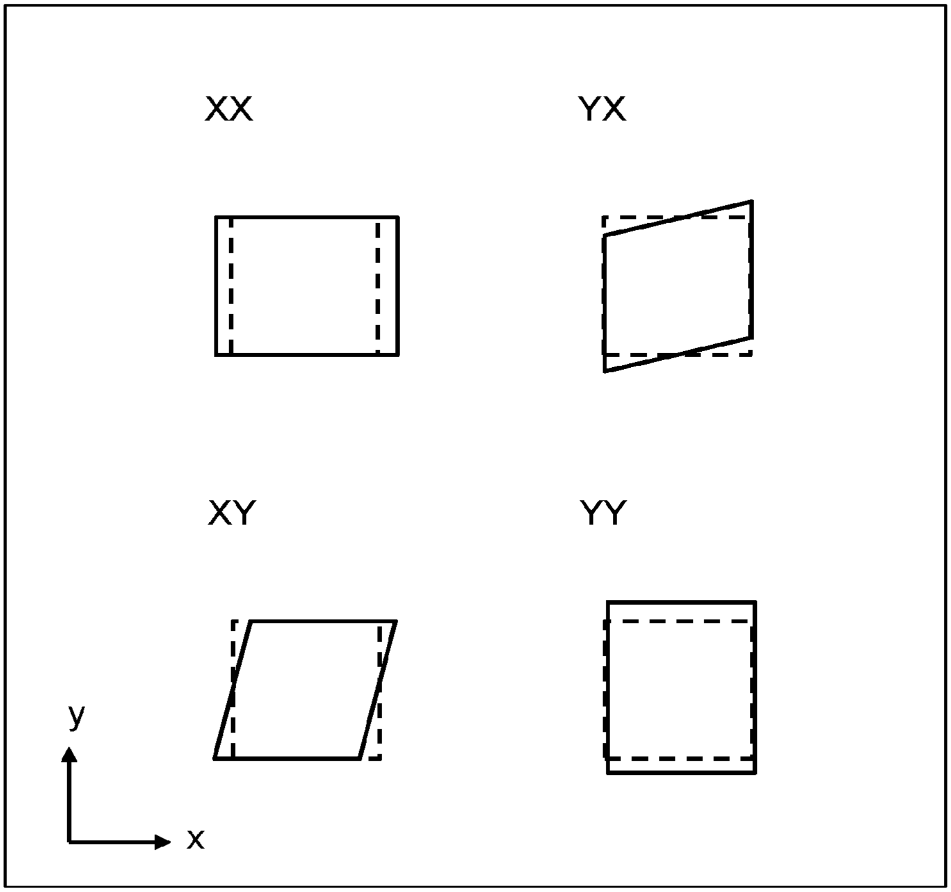
FIG. 5 is a diagram showing a parameter of a linear component according to the first embodiment.

FIG. 5 is a diagram showing a parameter of a linear component according to the first embodiment. In FIG. 5, the rectangular beam array shape in design is shown by dotted lines. The XX linear component indicates an x-direction displacement component which extends (or narrows) in the x direction with respect to the design beam array shape. The YY linear component indicates a y-direction displacement component which extends (or narrows) in the y direction with respect to the design beam array shape. The XY linear component indicates an oblique displacement component which shifts in the x direction while maintaining the y direction with respect to the design beam array shape. The YX linear component indicates an oblique displacement component which shifts in the y direction while maintaining the x direction with respect to the design beam array shape. $A_{XX}$ indicates a linear component parameter depending on an extending (or narrowing) amount in the x direction with respect to the design beam array shape. $A_{YY}$ indicates a linear component parameter depending on an extending (or narrowing) amount in the y direction with respect to the design beam array shape. $A_{XY}$ indicates a linear component parameter depending on an inclination amount of the y-direction extending side inclining in the x direction with respect to the design beam array shape. $A_{YX}$ indicates a linear component parameter depending on an inclination amount of the x-direction extending side inclining in the y direction with respect to the design beam array shape.

The x-coordinate X of each point in the beam array shape can be approximated by the following equation (1-1) using the design coordinates (x, y). Similarly, the y-coordinate Y of each point in the beam array shape can be approximated by the following equation (1-2) using the design coordinates (x, y).

$$X=A_{XX}\cdot x+A_{XY}\cdot y \quad (1\text{-}1)$$

$$Y=A_{YX}\cdot x+A_{YY}\cdot y \quad (1\text{-}2)$$

Figure 6A:
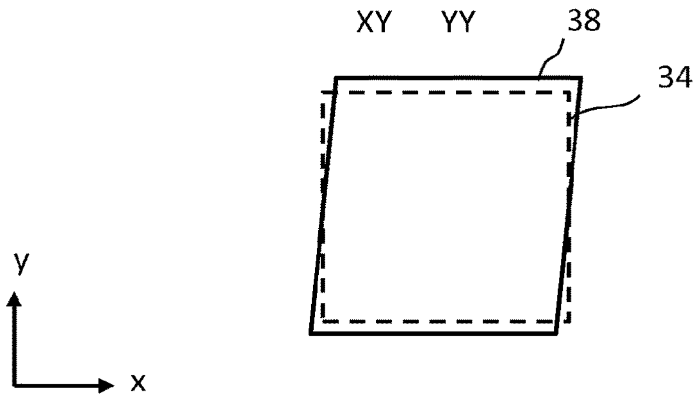
FIGS. 6A and 6B are diagrams for explaining multiple writing while shifting according to a comparative example of the first embodiment.
Figure 6B:
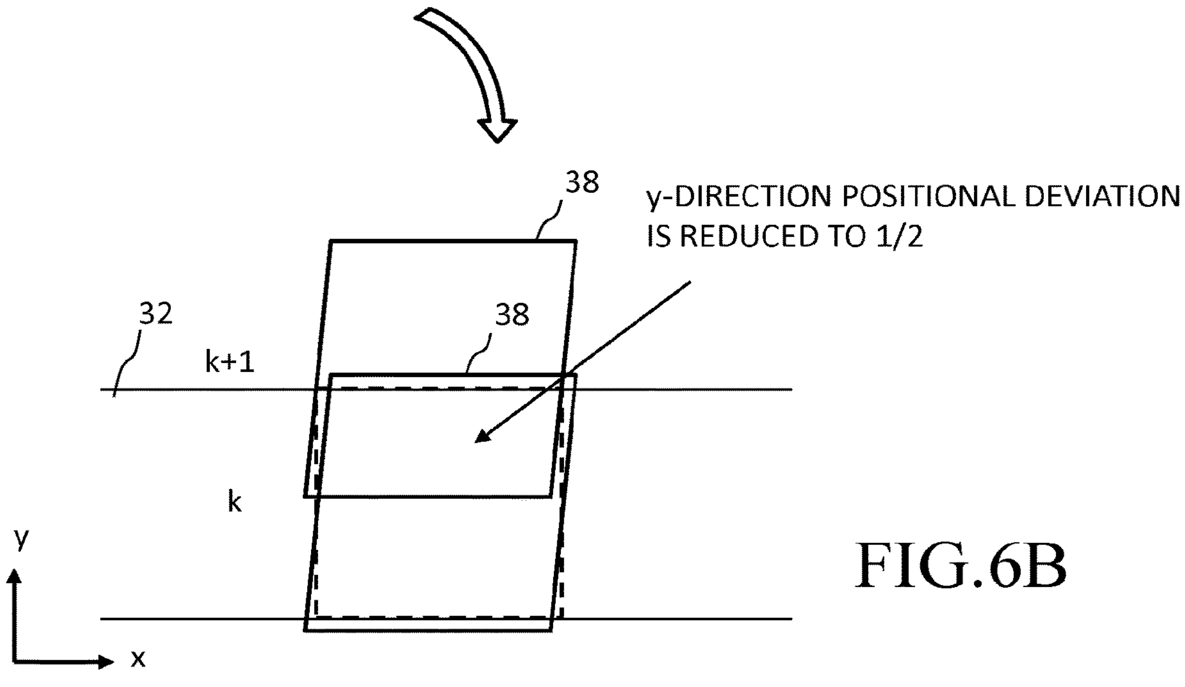

FIGS. 6A and 6B are diagrams for explaining multiple writing while shifting according to a comparative example of the first embodiment. In FIG. 6A, the design beam array shape (dotted line) is the same as the shape of the design irradiation region 34 of the multiple beams 20. The example of FIG. 6A shows a beam array shape 38 (solid line) whose linear components YY and XY are displaced. As shown in FIG. 6B, for example, after writing the k-th stripe region (e.g., first stripe layer), the (k+1)th stripe region (e.g., second stripe layer), whose position has been shifted in the y direction by a set displacement amount, is written. Thereby, multiple writing has been performed twice in the upper half region of the k-th stripe region. Thus, due to the writing performed twice by shifting the irradiation region, the positional deviation amount in the y direction is averaged and reduced to ½.

Figures 7A, 7B, 7C:
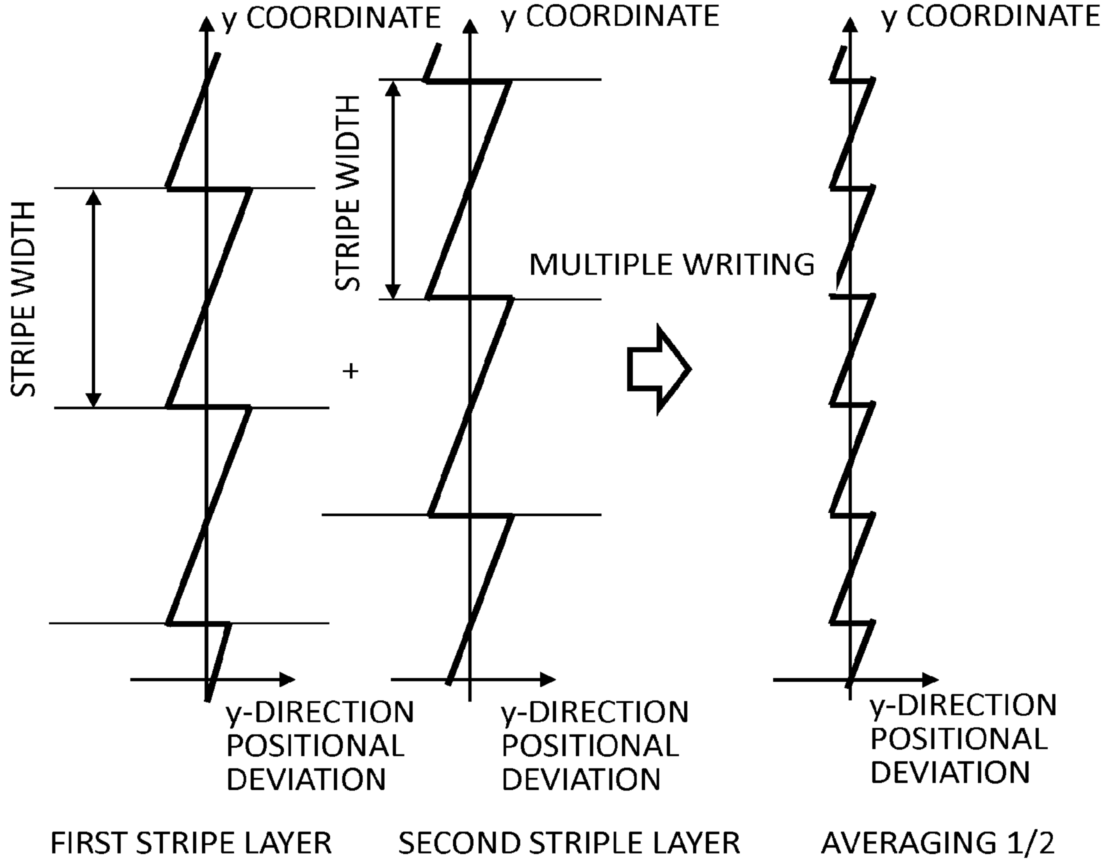
FIGS. 7A to 7C are diagrams for explaining an example of averaging a y-direction positional deviation amount according to a comparative example of the first embodiment.

FIGS. 7A to 7C are diagrams for explaining an example of averaging a y-direction positional deviation amount according to a comparative example of the first embodiment. FIGS. 7A to 7C show the case where multiple writing is performed with the multiple beams 20 of the beam array shape whose linear component YY has been displaced, for example. In the case of the beam array shape in which a positional deviation occurs extending in the y direction beyond the design shape, no positional deviation occurs at the center in the y direction among positions in the beam array shape. In contrast, at the y direction end, a positive positional deviation occurs. At the −y direction end, a negative, being a reversed sign, positional deviation occurs whose amount is the same as that of the positive positional deviation. When performing multiple writing with a positional deviation amount of ½ of the width of the stripe region 32, averaging is achieved by combining a positional deviation amount due to writing (first pass of multiple writing) of the first stripe layer shown in FIG. 7A and a positional deviation amount due to writing (second pass of multiple writing) of the second stripe layer shown in FIG. 7B. Therefore, as shown in FIG. 7C, the absolute value of the positional deviation amount can be reduced to ½. If multiple writing is performed four times while shifting the irradiation region in the y direction, the positional deviation amount can be reduced to ¼.

Thus, the averaging effect can be enhanced by increasing the number of passes of multiple writing (multiplicity) which is performed while shifting the irradiation region in the y direction. However, increasing the number of passes of multiple writing leads to increasing the writing time (period). In order to prevent the writing time increase, the stage speed needs to be increased in proportion to the increase in the number of passes. Then, according to the first embodiment, the Y deflection of shifting the irradiation region 34 of the multiple beams 20 in the y direction is performed during writing in each stripe region 32. It will be specifically described.

Figure 8:
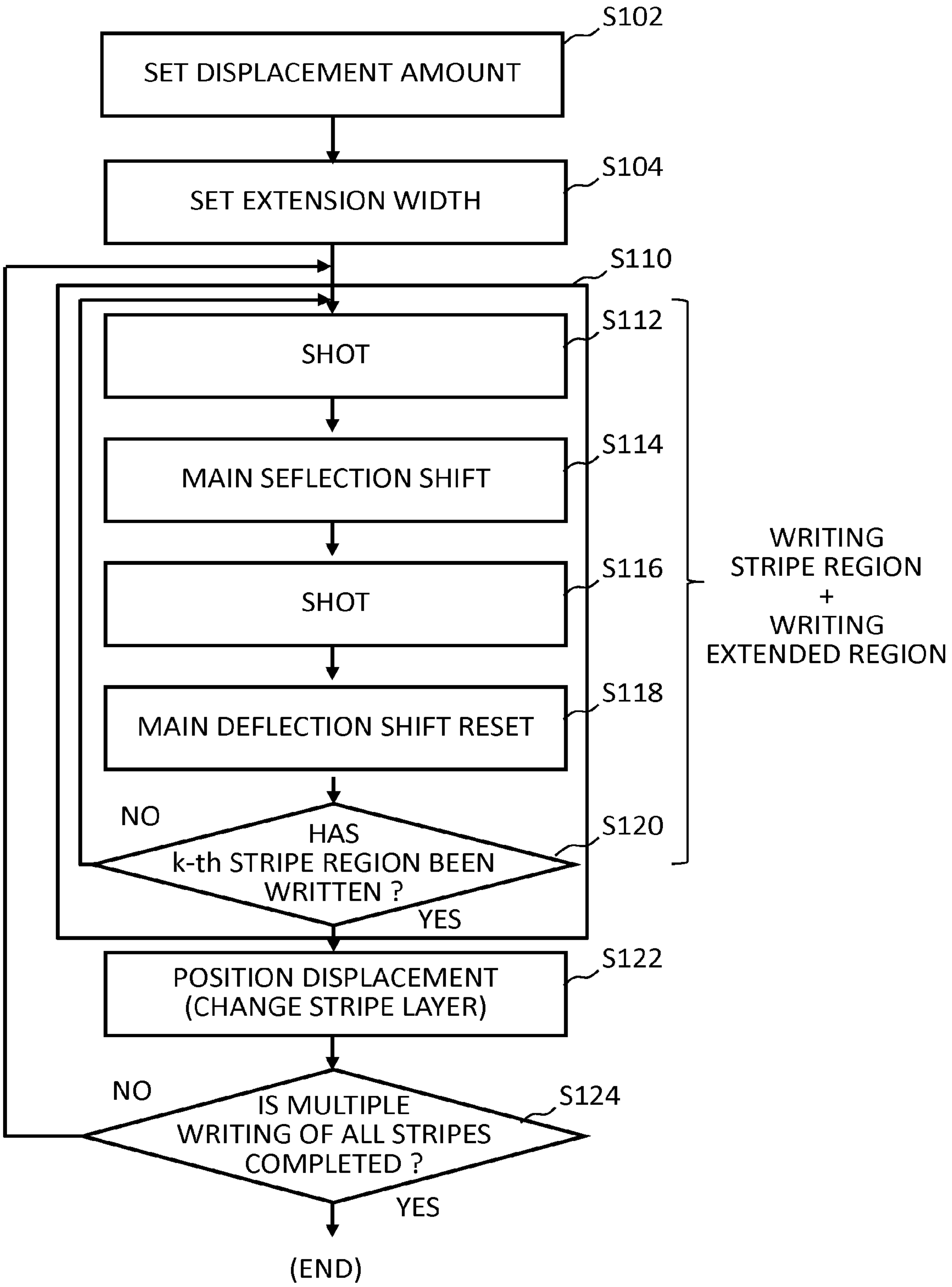
FIG. 8 is a flowchart showing an example of main steps of a writing method according to the first embodiment.

FIG. 8 is a flowchart showing an example of main steps of a writing method according to the first embodiment. In FIG. 8, the writing method of the first embodiment executes a series of steps: a displacement amount setting step (S102), an extension width setting step (S104), a stripe region and extended region writing step (S110), a position displacement step (S122), and a determination step (S124).

As internal steps of the stripe region and extended region writing step (S110), a series of steps is executed: a shot step (S112), a main deflection shift (Y deflection) step (S114), a shot step (S116), a main deflection shift reset (Y deflection reset) step (S118), and a determination step (S120).

In the displacement amount setting step (S102), the displacement amount setting unit 50 sets a displacement amount of multiple writing which is performed while shifting the position in the y direction. In reference to the example of FIG. 4, the case of shifting the position by the amount of ½ of the y-direction width of the stripe region 32 will be described as an example.

In the extension width setting step (S104), the extension width setting unit 52 sets the width (extension width) of an extension region of the stripe region 32, which is to be extended by performing the Y deflection. The extension width is set to be a size different from the displacement amount. It is preferable that the extension width is set to be the size smaller than the displacement amount. Preferably, it is set to be ½ of the displacement amount.

In the stripe region and extended region writing step (S110), first, the writing data processing unit 70 reads chip data (writing data) stored in the storage device 140 in order to generate irradiation time data for each pixel. The irradiation time data is rearranged in order of shot in accordance with a preset writing sequence. The irradiation time data is stored in the storage device 142. The transmission processing unit 74 transmits, in order of shot, the irradiation time data to the deflection control circuit 130. The writing mechanism 150 writes a pattern on the target object 101 with the multiple beams 20. The writing control unit 72 controls the writing operation by the writing mechanism 150.

First, under the control of the writing control unit 72, the writing mechanism 150 writes a pattern in the k-th (k is an integer of one or more) stripe region 32 and its extended region of the writing target object 101. Said differently, the writing mechanism 150 performs writing in each stripe region 32, which is obtained by dividing the writing region on the surface of the target object 101 by a predetermined size width in the y direction, while deflecting the multiple beams 20 within the irradiation region 34 of the multiple beams 20 whose y-direction (first direction) design region width is a predetermined size and moving the irradiation region 34 in the x direction (second direction) orthogonal to the y direction. Further, during writing in the k-th (k is an integer of one or more) stripe region 32, the writing mechanism 150 writes the k-th extended region 37, which is obtained by extending the irradiation region in the y direction by a predetermined extension width, while deflecting the multiple beams 20 and moving the multiple beams 20 in the x direction. Furthermore, in other words, during writing in the k-th (k is an integer of one or more) stripe region 32, the writing mechanism 150 writes the k-th extended region while deflecting the multiple beams 20 within the irradiation region 34 which has been shifted by beam deflection in the y direction by the extension width. Specifically, it operates as follows:

In the shot step (S112), under the control of the writing control unit 72, while deflecting the multiple beams 20 in the irradiation region 34 of the multiple beams 20, the writing mechanism 150 performs writing with the multiple beams 20 in the k-th stripe region 32 in the target object 101, whose y-direction (first direction) width is the width size of the design irradiation region 34 of the multiple beams 20, and x-direction (second direction) width orthogonal to the y direction is longer than the y-direction width.

Figure 9:
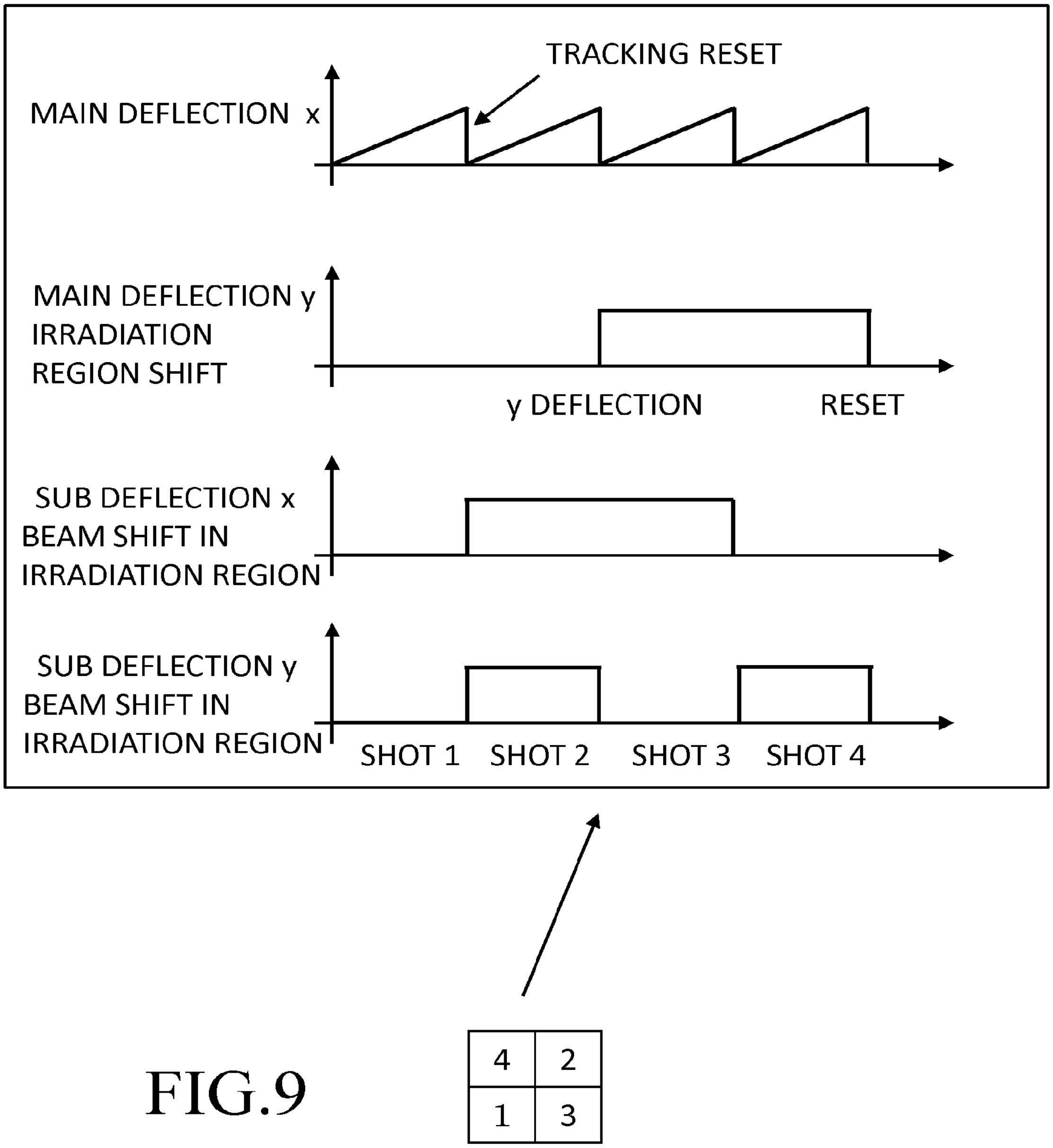
FIG. 9 is a diagram showing a time chart of a main deflection and a sub deflection, as an example of a writing sequence, according to the first embodiment.

FIG. 9 is a diagram showing a time chart of a main deflection and a sub deflection, as an example of a writing sequence, according to the first embodiment.

FIGS. 10A to 10D are diagrams each showing a part of an example of a writing sequence according to the first embodiment. In the case of FIGS. 10A to 10D, 4×4 multiple beams 20 are used. Further, one sub-irradiation region 29 (pitch cell) is configured by a rectangular region surrounded with the sizes of x- and y-direction beam pitches of the multiple beams 20. In the examples of FIG. 9 and FIGS. 10A to 10D, each sub-irradiation region 29 is composed of 2×2 pixels, for example. According to the writing sequence used in the examples of FIG. 9 and FIGS. 10A to 10D, writing is performed in the order of the lower left, the upper right, the lower right, and the upper left inside the sub-irradiation region 29. FIG. 9 and FIGS. 10A to 10D show the case where the inside of each sub-irradiation region 29 is written with four different beams.

While writing is performed in each stripe region 32, the XY stage 105 is moved in the −x direction (or x direction) opposite to the moving direction of the irradiation region 34 in order to relatively move the irradiation region 34. Then, during writing in each stripe region 32, a tracking control is performed so that the irradiation region 34 of the multiple beams 20 may follow the movement of the XY stage 105. Specifically, in order that the relative position of the irradiation region 34 with respect to the target object 101 may not be shifted by the movement of the XY stage 105 while one pixel, for example, is written (exposed), the irradiation region 34 is made to follow the movement of the XY stage 105 by collective deflection of all of the multiple beams 20 in the x direction by the main deflector 208. In other words, a tracking control is performed. Each of the examples of FIGS. 10A to 10D shows a writing operation where the XY stage 105 continuously moves at the speed at which the XY stage 105 moves the distance L being two pixels while a ¼ region (one pixel), namely the region of 1/(the number of beams used for irradiation), in each sub-irradiation region 29 is written.

The shot cycle is the total time of the maximum irradiation time of one beam shot and the settling time of the DAC amplifier of the deflector. As the tracking cycle which performs a tracking reset for every writing of one pixel, the same time as the maximum irradiation time of one beam shot can be used. The maximum irradiation time of one beam shot is preset. For example, the irradiation time that is the maximum in all the shots in the writing processing including dose modulation, etc. can be set as the maximum irradiation time.

The tracking control is controlled by an x-direction deflection (main deflection X) by the main deflector 208, for example. After one tracking cycle is completed, the tracking is reset to return to the last tracking starting position. In the examples of FIG. 9 and FIGS. 10A to 10D, as the main deflection X, the tracking control is reset every one shot of the multiple beams 20. Shifting of the irradiation position of the multiple beams 20 in the irradiation region 34 is controlled by a combination of an x-direction deflection (sub deflection X) and a y-direction deflection (sub deflection Y) by the sub deflector 209.

Under the control of the writing control unit 72, while performing writing in each stripe region 32, the writing mechanism 150 further writes an extended region 37 of the stripe region 32, which has been extended in the y direction, with the multiple beams 20 by moving the irradiation region 34 of the multiple beams 20 in the y direction by beam deflection. The beam deflection to each extended region 37 is performed at the time of a tracking reset which resets the tracking control. In the examples of FIG. 9 and FIGS. 10A to 10D, the extended region 37 is written by the third and fourth shots in the four-time shots to irradiate four pixels in each sub-irradiation region 29.

Figure 10A:
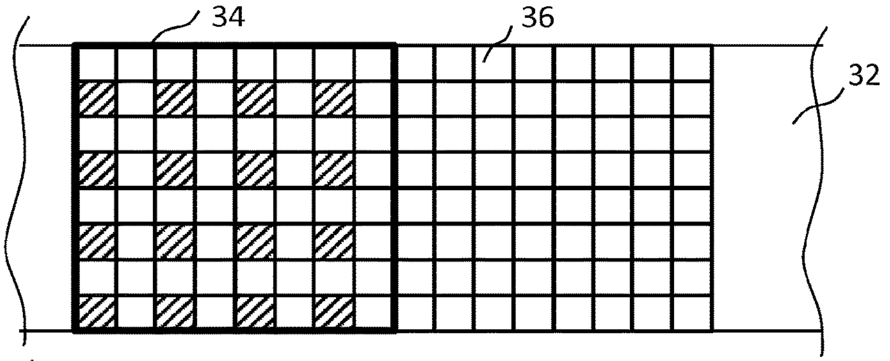
FIGS. 10A to 10D are diagrams each showing a part of an example of a writing sequence according to the first embodiment.

In FIG. 10A, while the tracking control is performed by the main deflection X, each beam irradiates, as the shot 1, the pixel at the lower left of the sub-irradiation region 29 concerned in the irradiation region 34 of the multiple beams 20.

When the maximum irradiation time of the shot 1 has passed, the tracking control is reset. During the tracking cycle of the shot 1, the XY stage 105 has moved the distance of two pixels. Therefore, by the tracking reset, the irradiation region 34 is moved in the x direction by two pixels.

By the shot 1, writing of the pixel at the lower left of each sub-irradiation region 29 has been completed. Therefore, after the tracking reset, the sub deflector 209, first, in the next tracking cycle, performs a deflection so that the writing position of the beam may be adjusted (shifted) to write the pixel at the upper right, which has not yet been written, of each sub-irradiation region 29.

Figure 10B:
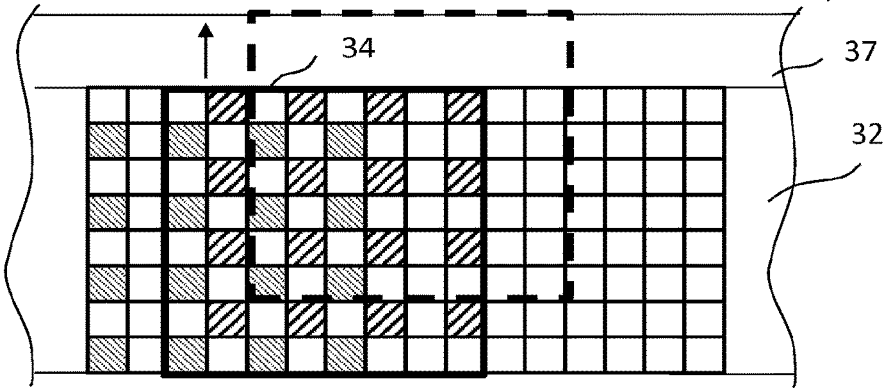

In FIG. 10B, while the tracking control is performed by the main deflection X, each beam irradiates, as the shot 2, the pixel at the upper right of the sub-irradiation region 29 concerned in the irradiation region 34 of the multiple beams 20.

When the maximum irradiation time of the shot 2 has passed, the tracking control is reset. During the tracking cycle of the shot 2, the XY stage 105 has moved the distance of two pixels. Accordingly, by the tracking reset, the irradiation region 34 is moved in the x direction by two pixels.

By the shot 2, writing of the pixel at the upper right of each sub-irradiation region 29 has been completed. Therefore, after the tracking reset, the sub deflector 209, first, in the next tracking cycle, performs a deflection so that the writing position of the beam may be adjusted (shifted) to write the pixel at the lower right, which has not yet been written, of each sub-irradiation region 29.

In the main deflection shift (Y deflection) step (S114), in accordance with the tracking reset after the shot 2, the main deflector 208 performs a deflection (Y deflection: main deflection Y) so that the irradiation region 34 of the multiple beams 20 may be shifted in the y direction by a set extension width. In other words, the deflection for shifting the irradiation region 34 in order to extend the irradiation region is executed at the time of a tracking reset which resets the tracking control. In the example of FIG. 10B, the irradiation region 34 of the multiple beams 20 is shifted in the y direction by two pixels as the extension width.

Figure 10C:
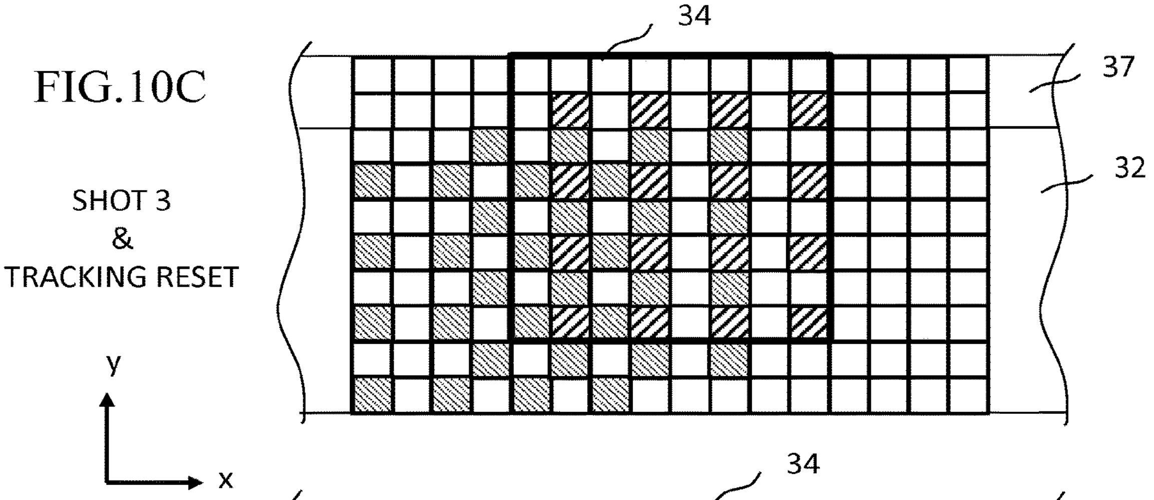

In the shot step (S116), in the state where the irradiation region 34 of the multiple beams 20 has been deflected in the y direction by the extension width by the Y deflection, the k-th stripe region 32 and the extended region 37 of the k-th stripe region 32, which has been extended in the y direction, are written with the multiple beams 20. In other words, while performing writing in the k-th stripe region 32, further, the extended region 37 of the k-th stripe region 32, which has been extended in the y direction, is written with the multiple beams 20 by moving the irradiation region 34 of the multiple beams 20 in the y direction by beam deflection. In further other words, when the k-th extended region 37 is written, the irradiation region 34 is moved in the y direction by deflecting the multiple beams 20 so that the k-th extended region 37 may be included in the irradiation region 34. Moving the irradiation region 34 in the y direction during writing in the k-th stripe region 32 is performed at the time of a tracking reset which resets the tracking control. Specifically, it operates as follows:

As shown in FIG. 10C, while the tracking control is performed by the main deflection X, each beam irradiates, as the shot 3, the pixel at the lower right of the sub-irradiation region 29 concerned in the irradiation region 34 of the multiple beams 20. Each beam whose irradiation position has been moved to the extended region 37 by shifting the irradiation region 34 irradiates the pixel at the lower right of the sub-irradiation region 29 concerned in the extended region 37 of the k-th stripe region 32. Furthermore, each beam whose irradiation position remains in the k-th stripe region 32 without being moved to the extended region 37 irradiates the pixel at the lower right of the sub-irradiation region 29 concerned in the k-th stripe region 32.

When the maximum irradiation time of the shot 3 has passed, the tracking control is reset. During the tracking cycle of the shot 3, the XY stage 105 has moved the distance of two pixels. Accordingly, by the tracking reset, the irradiation region 34 is moved in the x direction by two pixels.

By the shot 3, writing of the pixel at the lower right of each sub-irradiation region 29 has been completed. Therefore, after the tracking reset, the sub deflector 209, first, in the next tracking cycle, performs a deflection so that the writing position of the beam may be adjusted (shifted) to write the pixel at the upper left, which has not yet been written, of each sub-irradiation region 29.

Figure 10D:
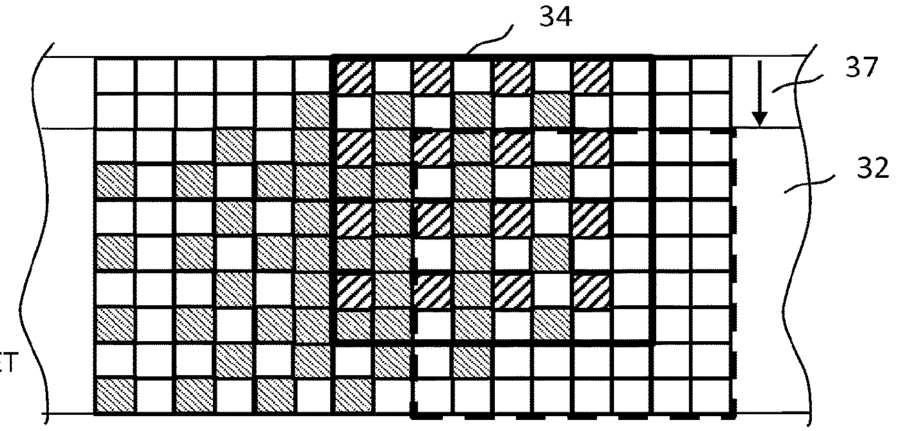

In FIG. 10D, while the tracking control is performed by the main deflection X, each beam irradiates, as the shot 4, the pixel at the upper left of the sub-irradiation region 29 concerned in the irradiation region 34 of the multiple beams 20. Since the shot 4 is in the state where the irradiation region 34 of the multiple beams 20 has been deflected in the y direction by the extension width by the Y deflection, further, the extended region 37 of the k-th stripe region 32 is written with the multiple beams 20 while the k-th stripe region 32 is being written. Specifically, each beam whose irradiation position has been moved to the extended region 37 irradiates the pixel at the upper left of the sub-irradiation region 29 concerned in the extended region 37 of the k-th stripe region 32. Furthermore, each beam whose irradiation position remains in the k-th stripe region 32 without being moved to the extended region 37 irradiates the pixel at the upper left of the sub-irradiation region 29 concerned in the k-th stripe region 32.

0002 The inside of each sub-irradiation region 29 surrounded with the beam pitch size on the surface of the target object 101 of the multiple beams 20 in each stripe region 32 is exposed with a combination of a pixel written in the state where the irradiation region 34 concerned has not been deflected, and a pixel written in the state where the irradiation region 34 concerned has been deflected. Specifically, the inside of each sub-irradiation region 29 surrounded with the beam pitch size on the surface of the target object 101 of the multiple beams 20 in each stripe region 32 is exposed with a combination of a beam shot (here, shot 1 or shot 2) in the state where the beam deflection to the extended region 37 of the stripe region 32 concerned is not performed, and a beam shot (here, shot 3 or shot 4) in the state where the beam deflection to the extended region 37 of the stripe region 32 concerned has been performed.

When the maximum irradiation time of the shot 4 has passed, the tracking control is reset. During the tracking cycle of the shot 4, the XY stage 105 has moved the distance of two pixels. Accordingly, by the tracking reset, the irradiation region 34 is moved in the x direction by two pixels.

In the main deflection shift reset (Y deflection reset) step (S118), in accordance with the tracking reset after the shot 4, the state where the irradiation region 34 of the multiple beams 20 has been deflected in the y direction by the extension width by the Y deflection is reset (Y deflection reset). In the Y deflection reset, the main deflector 208 performs a deflection so that the irradiation region 34 of the multiple beams 20 may be shifted in the −y direction by the extension width. In other words, resetting the movement of the irradiation region 34, which has been moved in the y direction, during writing in the k-th stripe region 32 is performed at the time of the tracking reset of resetting the tracking control. Further, the inside of the sub-irradiation region 29 in the k-th stripe region 32 is exposed with a combination of a pixel written in the state where the k-th extended region 37 is not written, and a pixel written while the k-th extended region 37 is written.

By the shot 4, writing of the four pixels in each sub-irradiation region 29 has been completed. Therefore, after the tracking reset, the sub deflector 209, first, in the next tracking cycle, performs a deflection so that the writing position of the beam may be adjusted (shifted) to write the pixel at the lower left, which was first written, of each sub-irradiation region 29.

In the determination step (S120), the writing control unit 72 determines whether writing of the k-th stripe region 32 has been completed. When completed, it proceeds to the position displacement step (S122). When not completed, it returns to the shot step (S112), and repeats the steps from the shot step (S112) to the determination step (S120) until writing of the k-th stripe region 32 has been completed. In the state of FIG. 10D, since writing of the k-th stripe region 32 has not been completed yet, it repeats from the shot step (S112) to the determination step (S120) as described below.

Figures 11A, 11B, 11C:
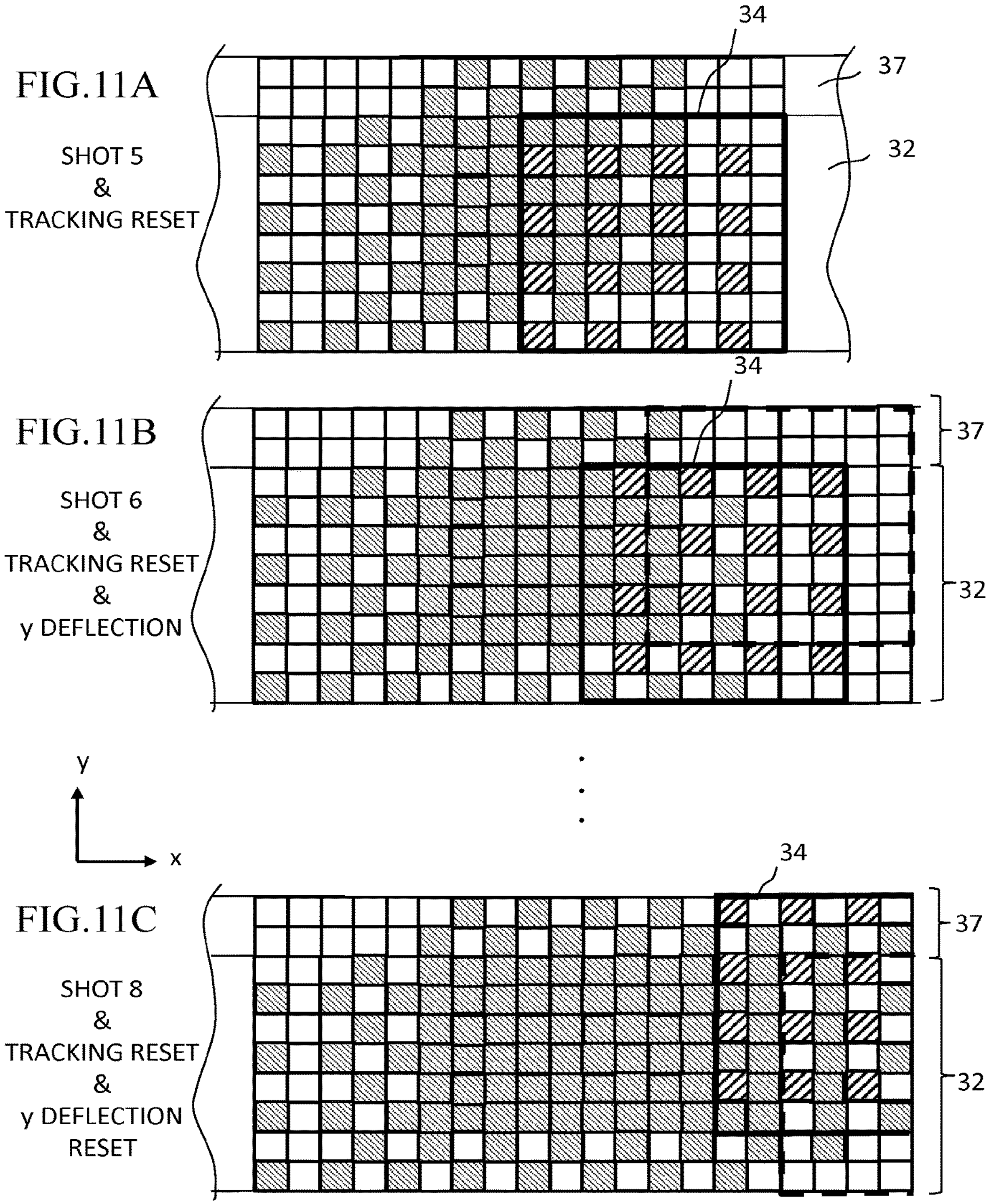
FIGS. 11A to 11C are diagrams each showing a continued part of an example of a writing sequence according to the first embodiment.

FIGS. 11A to 11C are diagrams each showing a continued part of an example of a writing sequence according to the first embodiment. The examples of FIGS. 11A to 11C show an example of the writing sequence continued from FIG. 10D.

In FIG. 11A, similarly to the shot 1, while the tracking control is performed by the main deflection X, each beam irradiates, as the shot 5, the pixel at the lower left of the sub-irradiation region 29 concerned in the irradiation region 34 of the multiple beams 20.

When the maximum irradiation time of the shot 5 has passed, the tracking control is reset. During the tracking cycle of the shot 5, the XY stage 105 has moved the distance of two pixels. Therefore, by the tracking reset, the irradiation region 34 is moved in the x direction by two pixels.

By the shot 5, writing of the pixel at the lower left of each sub-irradiation region 29 has been completed. Therefore, after the tracking reset, the sub deflector 209, first, in the next tracking cycle, performs a deflection so that the writing position of the beam may be adjusted (shifted) to write the pixel at the upper right, which has not yet been written, of each sub-irradiation region 29.

In FIG. 11B, similarly to the shot 2, while the tracking control is performed by the main deflection X, each beam irradiates, as the shot 6, the pixel at the upper right of the sub-irradiation region 29 concerned in the irradiation region 34 of the multiple beams 20.

When the maximum irradiation time of the shot 6 has passed, the tracking control is reset. During the tracking cycle of the shot 6, the XY stage 105 has moved the distance of two pixels. Accordingly, by the tracking reset, the irradiation region 34 is moved in the x direction by two pixels.

By the shot 6, writing of the pixel at the upper right of each sub-irradiation region 29 has been completed. Therefore, after the tracking reset, the sub deflector 209, first, in the next tracking cycle, performs a deflection so that the writing position of the beam may be adjusted (shifted) to write the pixel at the lower right, which has not yet been written, of each sub-irradiation region 29.

In the example of FIG. 11B, further, in accordance with the tracking reset, the main deflector 208 performs a deflection (Y deflection: main deflection Y) so that the irradiation region 34 of the multiple beams 20 may be shifted in the y direction by a set extension width. In the case of FIG. 11B, the irradiation region 34 of the multiple beams 20 is shifted in the y direction by two pixels as the extension width.

Thus, the shots 5 and 6 perform the same operations as those of the shots 1 and 2. In other words, operations of the shots 1 to 4 are repeated until writing of the k-th stripe region 32 has been completed. By this, the k-th stripe region 32 and the extended region 37 of the k-th stripe region 32 are written. FIG. 11C shows the state where the shot 8 has been executed.

By the process described above, each pixel in the k-th stripe region 32 is written. Further, some pixels in the extended region 37 of the k-th stripe region 32 are written. However, with respect to the region part of the k-th stripe region 32, having the same width as the extension width, located on the opposite direction (−y direction) side to the deflection direction (y direction) of the Y deflection, extending from the end of the k-th stripe region 32, there exist pixels that remain without being written as shown in FIG. 11C because the irradiation region 34 has been shifted in the y direction by the Y deflection. The pixel remaining without being written has a corresponding positional relationship with the pixel written in the extended region 37. In the example of FIG. 11C, the pixel at the lower right (shot 3+4(m−1)) and the pixel at the upper left (shot 4+4(m−1)) in the four (2×2) pixels in each sub-irradiation region 29 of the extended region 37 are written. Correspondingly to this, the pixels which remain without being written in the lower part of the k-th stripe region 32 are the pixel at the lower left (shot 1+4(m−1)) and the pixel at the upper right (shot 2+4(m−1)) in the four (2×2) pixels in each sub-irradiation region 29. Note that m is an integer of 1 or more.

In the position displacement step (S122), the stage control mechanism 138 controlled by the writing control unit 72 moves the XY stage 105 so that the irradiation region 34 of the multiple beams 20 may be located at the (k+1)th stripe region 32 which has been shifted in the y direction from the k-th stripe region 32 by a displacement amount different from the width size (extension width) in the y direction of the extended region 37 in a manner such that a part of the (k+1)th stripe region 32 is overlapped with the k-th stripe region 32. The XY stage 105 is herein moved so that the irradiation region 34 of the multiple beams 20 may be located at the (k+1)th stripe region 32 which has been shifted in the y direction from the k-th stripe region 32 by an already set displacement amount. In the examples of FIGS. 10A to 10D and FIGS. 11A to 11C, ½ of the y-direction width of the stripe region 32 is set as the displacement amount. When the k-th stripe region 32 is, for example, the first stripe layer, the (k+1)th stripe region 32 is the second stripe layer. Thus, by shifting the position according to the displacement amount, the stripe layer of the stripe region 32 to be written is changed.

In the determination step (S124), the writing control unit 72 determines whether multiple writing of all the stripe regions 32 has been completed. When there remains the stripe region 32 in which multiple writing has not been executed yet, it returns to the stripe region and extended region writing step (S110), and each step from the stripe region and extended region writing step (S110) to the determination step (S124) is repeated until multiple writing in all the stripe regions 32 has been completed.

After the stripe region and extended region writing step (S110) for the k-th stripe region 32, the next step to execute is the stripe region and extended region writing step (S110) for the (k+1)th stripe region 32 which has been shifted in the y direction from the k-th stripe region 32 by a displacement amount. Said differently, the writing mechanism 150 writes the (k+1)th stripe region 32 which has been shifted in the y direction from the k-th stripe region 32 by a displacement amount different from the extension width in a manner such that a part of the (k+1)th stripe region 32 is overlapped with the k-th stripe region 32. Further, during writing in the (k+1)th stripe region, the writing mechanism 150 performs writing in the (k+1)th extended region, which is obtained by extending the irradiation region 34 in the y direction by the extension width, while deflecting and moving the multiple beams 20 in the x direction. In further other words, during writing in the (k+1)th stripe region, the writing mechanism 150 writes the (k+1)th extended region while deflecting the multiple beams 20 within the irradiation region 34 which has been deflected in the y direction. It will be specifically described.

In the shot step (S112) for the (k+1)th stripe region 32, under the control of the writing control unit 72, the writing mechanism 150 writes, with the multiple beams 20, the (k+1)th stripe region 32 which has been shifted in the y direction from the k-th stripe region 32 by a displacement amount different from the width size in the y direction of the extended region 37 in a manner such that a part of the (k+1)th stripe region 32 is overlapped with the k-th stripe region 32. The method of writing is the same as that for the k-th stripe region 32.

In the main deflection shift (Y deflection) step (S114) for the (k+1)th stripe region 32, in accordance with the tracking reset after the shot 2, the main deflector 208 performs a deflection (Y deflection: main deflection Y) so that the irradiation region 34 of the multiple beams 20 may be shifted in the y direction by a set extension width. In the example of FIG. 10B, the irradiation region 34 of the multiple beams 20 is shifted in the y direction by two pixels as the extension width. The method of the Y deflection is the same as that performed while writing the k-th stripe region 32.

In the shot step (S116) for the (k+1)th stripe region 32, under the control of the writing control unit 72, in the state where the irradiation region 34 of the multiple beams 20 has been deflected in the y direction by the extension width by the Y deflection, the writing mechanism 150 writes with the multiple beams 20, during writing in the (k+1)th stripe region 32, the extended region 37 of the (k+1)th stripe region 32 which has been extended in the y direction by moving the irradiation region 34 of the multiple beams 20 in the y direction by beam deflection. The method of writing is the same as that for the k-th stripe region 32.

As described above, by performing writing in order from the first stripe region 32, in which the stripe region 32 of the first stripe layer and the stripe region 32 of the second stripe layer are alternately arranged, to the n-th stripe region 32 (k=1 to k=n), multiple writing of the writing region 30 of the target object 101 is performed with an exposure of the multiple beams 20 while shifting the stripe region by a set displacement amount. Each of the various deflection amounts in FIG. 9 shows, not an absolute value, but a relative value of a deflection amount at each time. For example, in the cases of FIGS. 11A to 11C, it is acceptable for the main deflection Y to switch between the deflection amount of two pixels in the +y direction and zero, or to switch between the deflection amount of one pixel in the −y direction and the deflection amount of one pixel in the +y direction.

Figure 12:
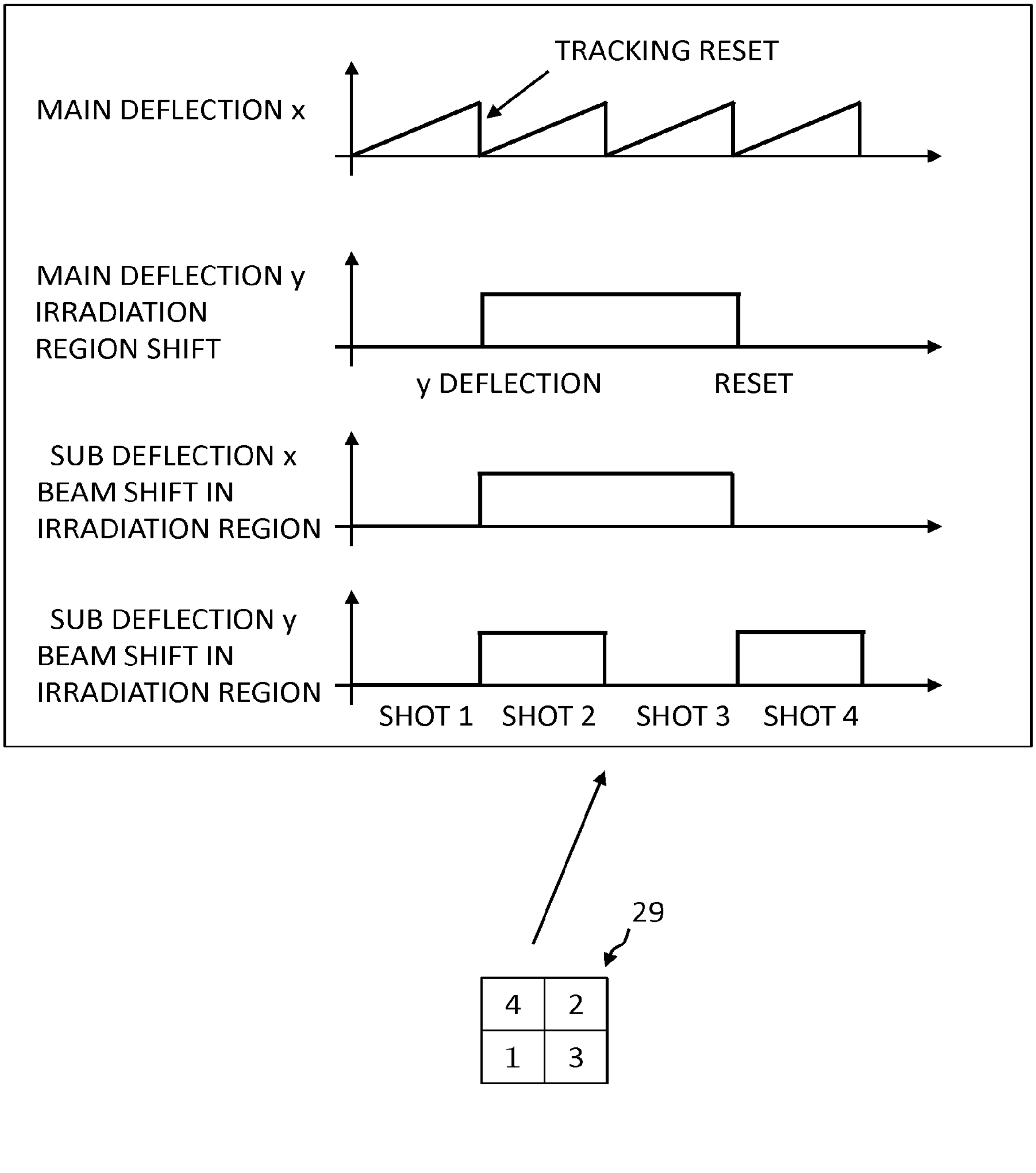
FIG. 12 is a diagram showing a time chart of a main deflection and a sub deflection, as another example of a writing sequence, according to the first embodiment.

FIG. 12 is a diagram showing a time chart of a main deflection and a sub deflection, as another example of a writing sequence, according to the first embodiment.

Figure 13A:
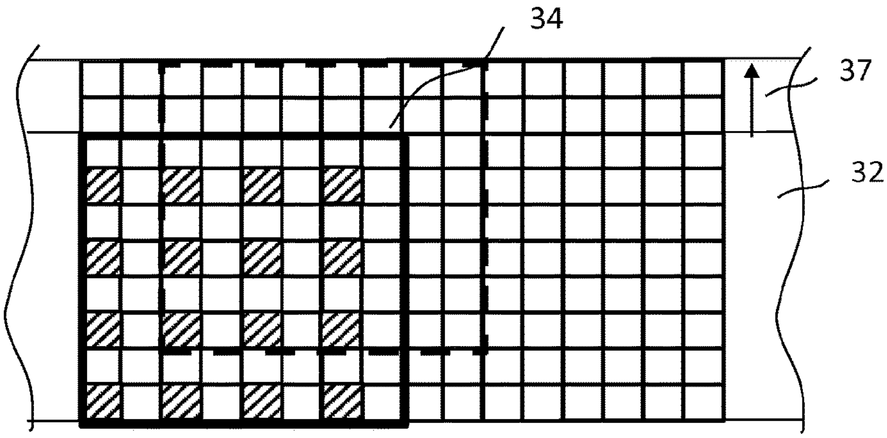
FIGS. 13A to 13C are diagrams each showing a part of another example of a writing sequence according to the first embodiment.
Figure 13B:
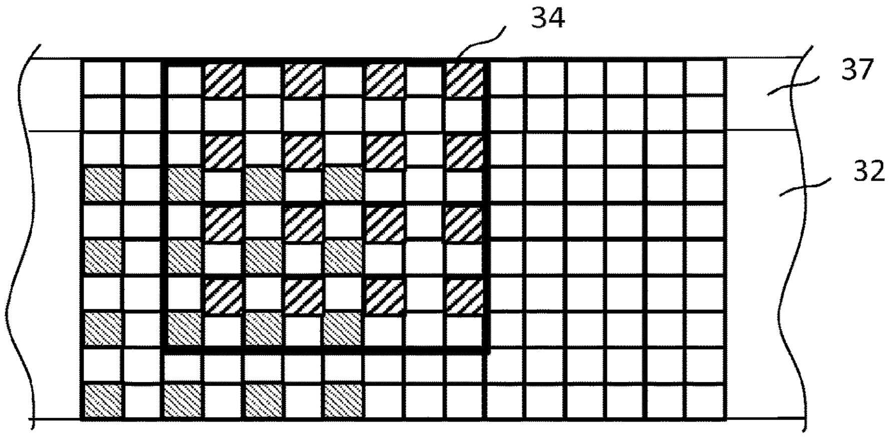
Figure 13B:
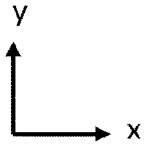
Figure 13C:
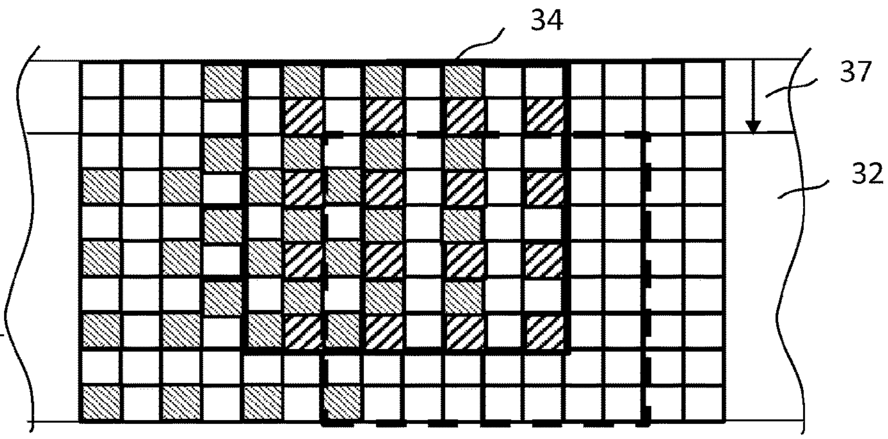

FIGS. 13A to 13C are diagrams each showing a part of another example of a writing sequence according to the first embodiment.

Figure 14A:
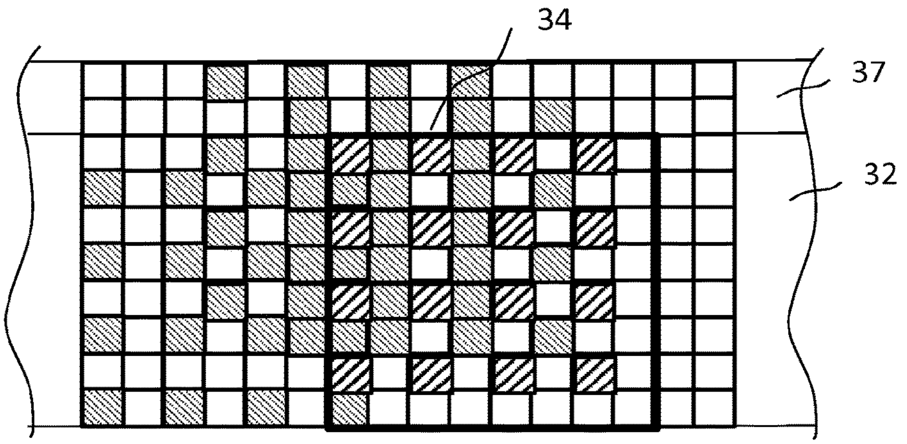
FIGS. 14A to 14C are diagrams each showing a continued part of another example of a writing sequence according to the first embodiment.
Figure 14B:
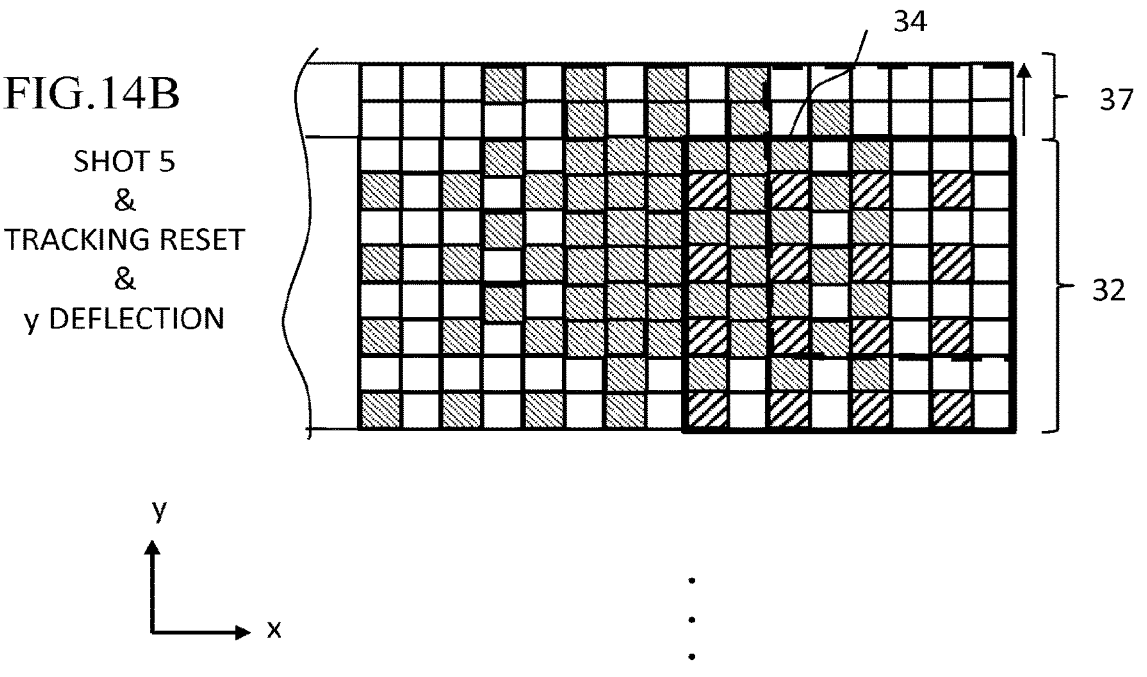
Figure 14C:
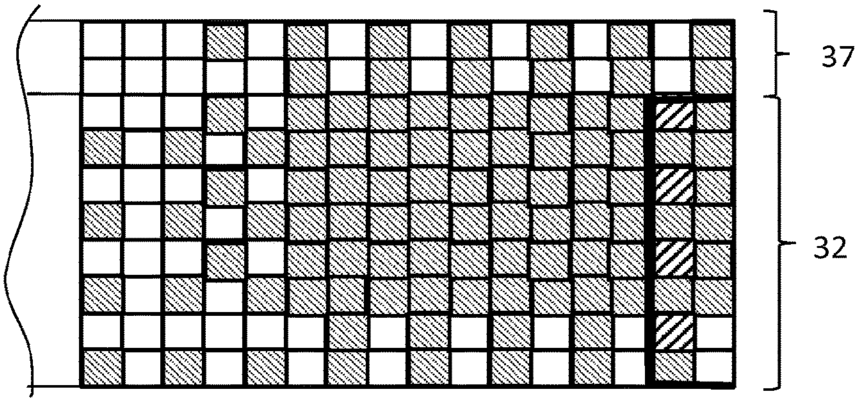

FIGS. 14A to 14C are diagrams each showing a continued part of another example of a writing sequence according to the first embodiment. In the examples of FIG. 12 to FIG. 14C, similarly to the examples of FIG. 9 to FIG. 11C, during writing in each stripe region 32, further, the extended region 37 of the stripe region 32 having been extended in the y direction is written with the multiple beams 20 by moving the irradiation region 34 of the multiple beams 20 in the y direction by beam deflection. The beam deflection to each extended region 37 is performed at the time of a tracking reset which resets the tracking control. In the examples of FIG. 12 to FIG. 14C, the extended region 37 is written by the second and third shots in the four-time shots to irradiate four pixels in each sub-irradiation region 29. Other respects are the same as those of FIG. 9 to FIGS. 11A to 11C.

In the shot step (S112), as shown in FIG. 13A, while the tracking control is performed by the main deflection X, each beam irradiates, as the shot 1, the pixel at the lower left of the sub-irradiation region 29 concerned in the irradiation region 34 of the multiple beams 20.

When the maximum irradiation time of the shot 1 has passed, the tracking control is reset. During the tracking cycle of the shot 1, the XY stage 105 has moved the distance of two pixels. Therefore, by the tracking reset, the irradiation region 34 is moved in the x direction by two pixels.

By the shot 1, writing of the pixel at the lower left of each sub-irradiation region 29 has been completed. Accordingly, after the tracking reset, the sub deflector 209, first, in the next tracking cycle, performs a deflection so that the writing position of the beam may be adjusted (shifted) to write the pixel at the upper right, which has not yet been written, of each sub-irradiation region 29.

In the main deflection shift (Y deflection) step (S114), in accordance with the tracking reset after the shot 1, the main deflector 208 performs a deflection (Y deflection: main deflection Y) so that the irradiation region 34 of the multiple beams 20 may be shifted in the y direction by a set extension width. In the example of FIG. 13A, the irradiation region 34 of the multiple beams 20 is shifted in the y direction by two pixels as the extension width.

In the shot step (S116), under the control of the writing control unit 72, in the state where the irradiation region 34 of the multiple beams 20 has been deflected in the y direction by the extension width by the Y deflection, the writing mechanism 150 writes with the multiple beams 20 the k-th stripe region 32 and the extended region 37 of the k-th stripe region 32 which has been extended in the y direction.

As shown in FIG. 13B, while the tracking control is performed by the main deflection X, each beam irradiates, as the shot 2, the pixel at the upper right of the sub-irradiation region 29 concerned in the irradiation region 34 of the multiple beams 20. Each beam whose irradiation position has been moved to the extended region 37 by shifting the irradiation region 34 irradiates the pixel at the upper right of the sub-irradiation region 29 concerned in the extended region 37 of the k-th stripe region 32. Furthermore, each beam whose irradiation position remains in the k-th stripe region 32 without being moved to the extended region 37 irradiates the pixel at the upper right of the sub-irradiation region 29 concerned in the k-th stripe region 32.

When the maximum irradiation time of the shot 2 has passed, the tracking control is reset. During the tracking cycle of the shot 2, the XY stage 105 has moved the distance of two pixels. Accordingly, by the tracking reset, the irradiation region 34 is moved in the x direction by two pixels.

As shown in FIG. 13C, while the tracking control is performed by the main deflection X, each beam irradiates, as the shot 3, the pixel at the lower right of the sub-irradiation region 29 concerned in the irradiation region 34 of the multiple beams 20. Since the shot 3 is in the state where the irradiation region 34 of the multiple beams 20 has been deflected in the y direction by the extension width by the Y deflection, further, the extended region 37 of the k-th stripe region 32 is written with the multiple beams 20 while the k-th stripe region 32 is being written. Specifically, each beam whose irradiation position has been moved to the extended region 37 irradiates the pixel at the lower right of the sub-irradiation region 29 concerned in the extended region 37 of the k-th stripe region 32. Furthermore, each beam whose irradiation position remains in the k-th stripe region 32 without being moved to the extended region 37 irradiates the pixel at the lower right of the sub-irradiation region 29 concerned in the k-th stripe region 32.

When the maximum irradiation time of the shot 3 has passed, the tracking control is reset. During the tracking cycle of the shot 3, the XY stage 105 has moved the distance of two pixels. Accordingly, by the tracking reset, the irradiation region 34 is moved in the x direction by two pixels.

In the main deflection shift reset (Y deflection reset) step (S118), in accordance with the tracking reset after the shot 3, the state where the irradiation region 34 of the multiple beams 20 has been deflected in the y direction by the extension width by the Y deflection is reset (Y deflection reset). In the Y deflection reset, the main deflector 208 performs a deflection so that the irradiation region 34 of the multiple beams 20 may be shifted in the −y direction by the extension width.

In the determination step (S120), the writing control unit 72 determines whether writing of the k-th stripe region 32 has been completed. When completed, it proceeds to the position displacement step (S122). When not completed, it returns to the shot step (S112), and repeats the steps from the shot step (S112) to the determination step (S120) until writing of the k-th stripe region 32 has been completed.

In FIG. 14A, while the tracking control is performed by the main deflection X, each beam irradiates, as the shot 4, the pixel at the upper left of the sub-irradiation region 29 concerned in the irradiation region 34 of the multiple beams 20.

When the maximum irradiation time of the shot 4 has passed, the tracking control is reset. During the tracking cycle of the shot 4, the XY stage 105 has moved the distance of two pixels. Therefore, by the tracking reset, the irradiation region 34 is moved in the x direction by two pixels.

By the shot 4, writing of four pixels in each sub-irradiation region 29 has been completed. Therefore, after the tracking reset, the sub deflector 209, first, in the next tracking cycle, performs a deflection so that the writing position of the beam may be adjusted (shifted) to write the pixel at the lower left, which was first written, in each sub-irradiation.

In FIG. 14B, similarly to the shot 1, while the tracking control is performed by the main deflection X, each beam irradiates, as the shot 5, the pixel at the lower left of the sub-irradiation region 29 concerned in the irradiation region 34 of the multiple beams 20.

When the maximum irradiation time of the shot 5 has passed, the tracking control is reset. During the tracking cycle of the shot 5, the XY stage 105 has moved the distance of two pixels. Accordingly, by the tracking reset, the irradiation region 34 is moved in the x direction by two pixels.

By the shot 5, writing of the pixel at the lower left of each sub-irradiation region 29 has been completed. Therefore, after the tracking reset, the sub deflector 209, first, in the next tracking cycle, performs a deflection so that the writing position of the beam may be adjusted (shifted) to write the pixel at the upper right, which has not yet been written, of each sub-irradiation region 29.

In the main deflection shift (Y deflection) step (S114), in accordance with the tracking reset after the shot 5, the main deflector 208 performs a deflection (Y deflection: main deflection Y) so that the irradiation region 34 of the multiple beams 20 may be shifted in the y direction by a set extension width. In the example of FIG. 14B, the irradiation region 34 of the multiple beams 20 is shifted in the y direction by two pixels as the extension width.

Thus, the shot 5 performs the same operation as that of the shot 1. In other words, operations of the shots 1 to 4 are repeated until writing of the k-th stripe region 32 has been completed. By this, the k-th stripe region 32 and the extended region 37 of the k-th stripe region 32 are written. FIG. 14C shows the state where the shot 8 has been executed.

By the process described above, each pixel in the k-th stripe region 32 is written. Further, some pixels in the extended region 37 of the k-th stripe region 32 are written. However, with respect to the region part of the k-th stripe region 32, having the same width as the extension width, located on the opposite direction (−y direction) side to the deflection direction (y direction) of the Y deflection, extending from the end of the k-th stripe region 32, there exist pixels that remain without being written as shown in FIG. 14C because the irradiation region 34 has been shifted in the y direction by the Y deflection. Regarding the shots conducted in turn, when the shot performed by the Y deflection is different, the position of the pixel written in the extended region 37 is different. In such a case, also, the pixel remaining without being written has a corresponding positional relationship with the pixel written in the extended region 37.

In the example of FIG. 14C, the pixel at the upper right (shot 2+4(m−1)) and the pixel at the lower right (shot 3+4(m−1)) in the four (2×2) pixels in each sub-irradiation region 29 of the extended region 37 are written.

Correspondingly to this, the pixels which remain without being written in the lower part of the k-th stripe region 32 are the pixel at the lower left (shot 1+4(m−1)) and the pixel at the upper left (shot 4+4(m−1)) in the four (2×2) pixels in each sub-irradiation region 29.

In the position displacement step (S122), the stage control mechanism 138 controlled by the writing control unit 72 moves the XY stage 105 so that the irradiation region 34 of the multiple beams 20 may be located at the (k+1)th stripe region 32 which has been shifted in the y direction from the k-th stripe region 32 by a displacement amount different from the width size (extension width) in the y direction of the extended region 37 in a manner such that a part of the (k+1)th stripe region 32 is overlapped with the k-th stripe region 32.

In the determination step (S124), the writing control unit 72 determines whether multiple writing of all the stripe regions 32 has been completed. When there remains the stripe region 32 in which multiple writing has not been executed yet, it returns to the stripe region and extended region writing step (S110), and each step from the stripe region and extended region writing step (S110) to the determination step (S124) is repeated until multiple writing in all the stripe regions 32 has been completed.

After the stripe region and extended region writing step (S110) for the k-th stripe region 32, the next step to execute is the stripe region and extended region writing step (S110) for the (k+1)th stripe region 32 which has been shifted in the y direction from the k-th stripe region 32 by a displacement amount.

In the examples described above, each sub-irradiation region 29 is composed of four (2×2) pixels. However, it is not limited thereto. Hereinafter, for example, the case where each sub-irradiation region 29 is composed of sixteen (4×4) pixels will be described. In addition, the number of pixels arranged in each sub-irradiation region 29 may yet be another number.

Figure 15A:
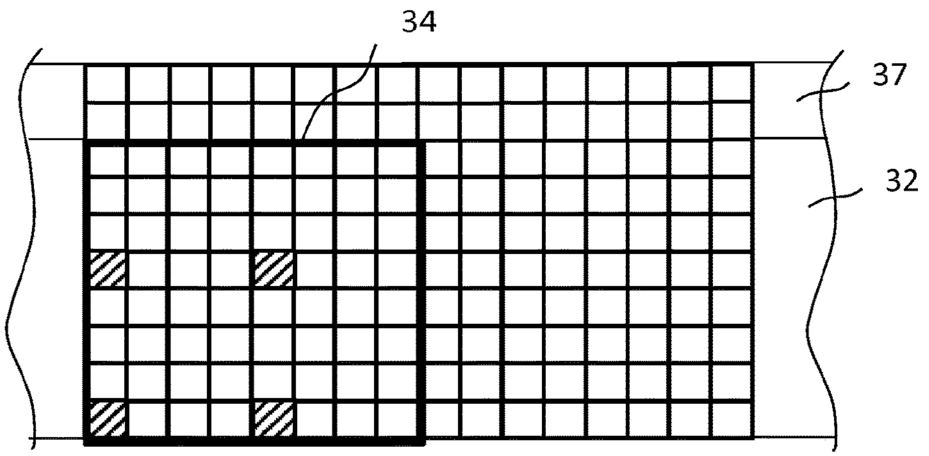
FIGS. 15A to 15C are diagrams each showing a part of another example of a writing sequence according to the first embodiment.
Figure 15B:
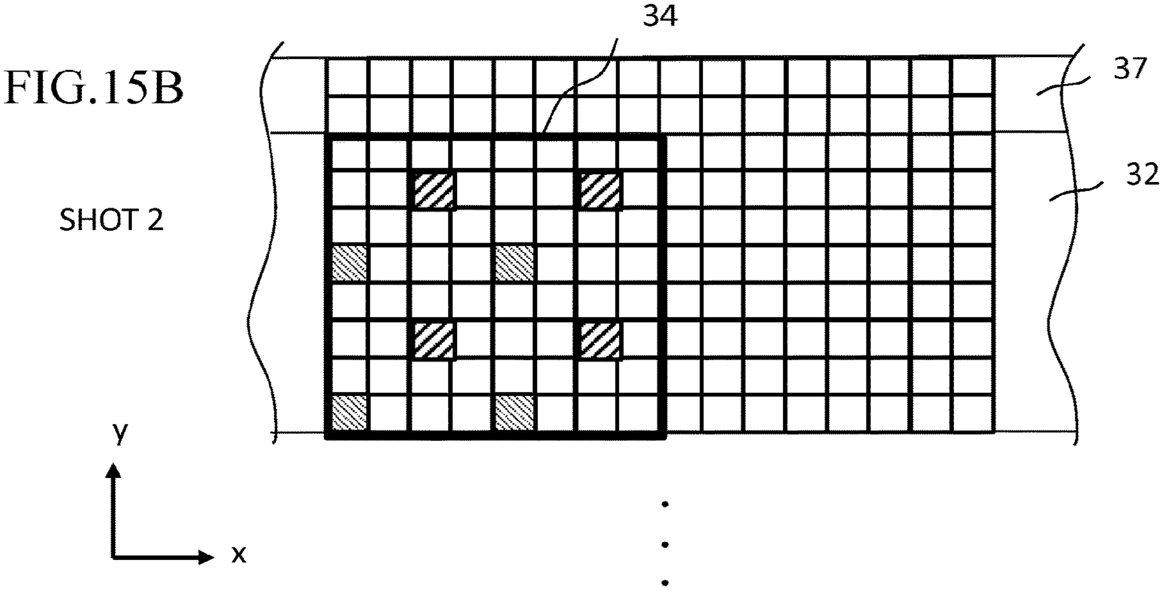
Figure 15C:
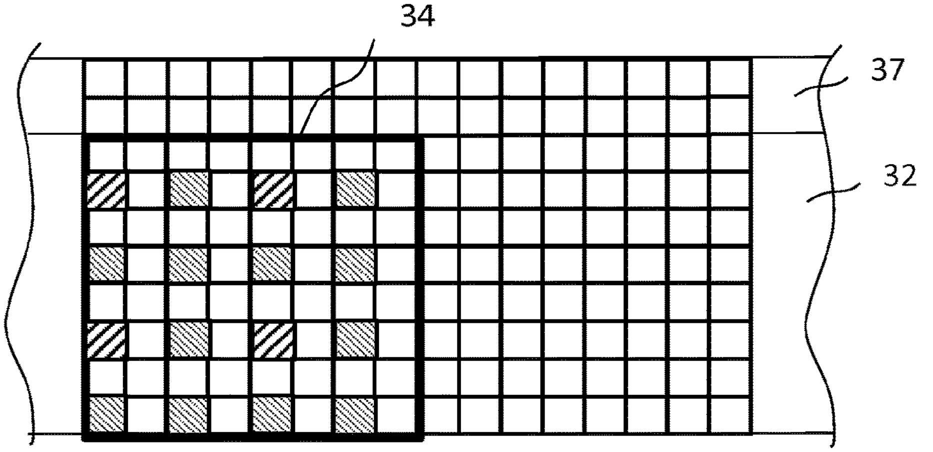

FIGS. 15A to 15C are diagrams each showing a part of another example of a writing sequence according to the first embodiment.

Figure 16A:
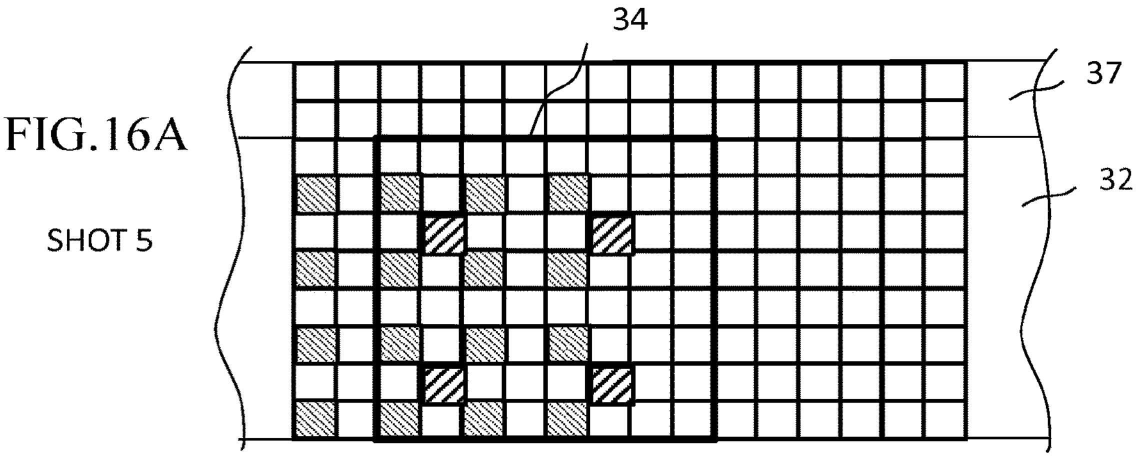
FIGS. 16A to 16C are diagrams each showing a continued part of another example of a writing sequence according to the first embodiment.
Figure 16B:
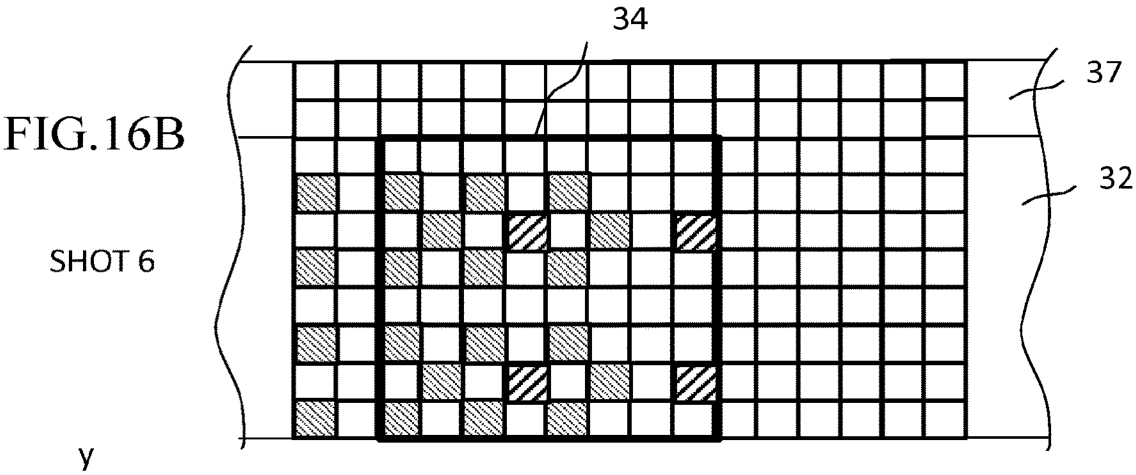
Figure 16C:
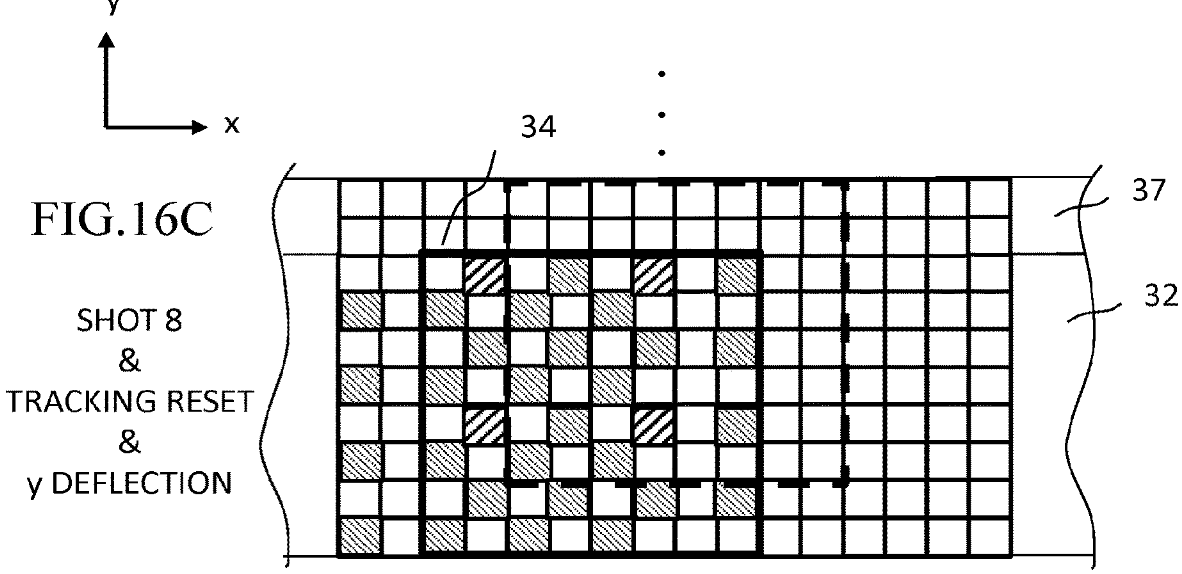

FIGS. 16A to 16C are diagrams each showing a continued part of another example of a writing sequence according to the first embodiment. In the cases of FIGS. 15A to 15C and FIGS. 16A to 16C, 2×2 multiple beams 20 are used. Further, each sub-irradiation region 29 is composed of 4×4 pixels, for example. In the examples of FIGS. 15A to 15C and FIGS. 16A to 16C, each sub-irradiation region 29 is written in order (from No. 1 to No. 16) according to the writing sequence, 1: the first column from the left and the first row from the bottom, 2: the third from the left and the third from the bottom, 3: the third from the left and the first from the bottom, 4: the first from the left and the third from the bottom, 5: the second from the left and the second from the bottom, 6: the fourth from the left and the second from the bottom, 7: the fourth from the left and the fourth from the bottom, 8: the second from the left and the fourth from the bottom, 9: the second from the left and the first from the bottom, 10: the fourth from the left and the third from the bottom, 11: the fourth from the left and the first from the bottom, 12: the second from the left and the third from the bottom, 13: the first from the left and the second from the bottom, 14: the third from the left and the second from the bottom, 15: the third from the left and the fourth from the bottom, and 16: the first from the left and the fourth from the bottom. Each example of FIGS. 15A to 15C and FIGS. 16A to 16C show writing eight pixels in sixteen (4×4) pixels. Further, each example of FIGS. 15A to 15C and FIGS. 16A to 16C shows the case of writing each sub-irradiation region 29 with four different beams.

While writing is performed in each stripe region 32, the XY stage 105 is moved in the x direction (or −x direction). Then, during the writing in each stripe region 32, a tracking control is performed so that the irradiation region 34 of the multiple beams 20 may follow the movement of the XY stage 105. Each of the examples of FIGS. 15A to 15C and FIGS. 16A to 16C shows a writing operation where the XY stage 105 continuously moves at the speed at which the XY stage 105 moves the distance of two pixels while a ¼ region (four pixels), namely the region of 1/(the number of beams used for irradiation), in each sub-irradiation region 29 is written.

During writing in each stripe region 32, the extended region 37 of the stripe region 32, having been extended in the y direction, is written with the multiple beams 20 by moving the irradiation region 34 of the multiple beams 20 in the y direction by beam deflection. The beam deflection to each extended region 37 is performed at the time of a tracking reset which resets the tracking control. In the examples of FIGS. 15A to 15C and FIGS. 16A to 16C, the extended region 37 is written by the nine to sixteen shots in the sixteen-time shots to irradiate sixteen pixels in each sub-irradiation region 29.

In FIG. 15A, while the tracking control is performed by the main deflection X, each beam irradiates, as the shot 1, the pixel in the first column from the left and the first row from the bottom of the sub-irradiation region 29 concerned in the irradiation region 34 of the multiple beams 20.

While the tracking control is continuously performed, the sub deflector 209 shifts the irradiation position of each beam to the third column from the left and the third row from the bottom in the sub-irradiation region 29 concerned by the sub deflections X and Y.

In FIG. 15B, while the tracking control is performed by the main deflection X, each beam irradiates, as the shot 2, the pixel in the third column from the left and the third row from the bottom of the sub-irradiation region 29 concerned in the irradiation region 34 of the multiple beams 20.

While the tracking control is continuously performed, the sub deflector 209 shifts the irradiation position of each beam to the third column from the left and the first row from the bottom in the sub-irradiation region 29 concerned by the sub deflections X and Y.

While the tracking control is performed by the main deflection X, each beam irradiates, as the shot 3 (not shown), the pixel in the third column from the left and the first row from the bottom of the sub-irradiation region 29 concerned in the irradiation region 34 of the multiple beams 20.

While the tracking control is continuously performed, the sub deflector 209 shifts the irradiation position of each beam to the first column from the left and the third row from the bottom in the sub-irradiation region 29 concerned by the sub deflections X and Y.

In FIG. 15C, while the tracking control is performed by the main deflection X, each beam irradiates, as the shot 4, the pixel in the first column from the left and the third row from the bottom of the sub-irradiation region 29 concerned in the irradiation region 34 of the multiple beams 20.

As described above, in the sub-irradiation region 29 of 4×4 pixels, the same state as that of the shot 1 shown in FIG. 10A can be obtained by performing, during the first tracking control, four shots while shifting the sub deflection position in the sub-irradiation region 29.

When the maximum irradiation time of the shot 4 has passed, the tracking control is reset. During the tracking cycles of the shots 1 to 4, the XY stage 105 has moved the distance L being two pixels. Therefore, by the tracking reset, the irradiation region 34 is moved in the x direction by two pixels.

After the tracking reset, the sub deflector 209, first, in the next tracking cycle, performs a deflection so that the writing position of the beam may be adjusted (shifted) to write the pixel in the second column from the left and the second row from the bottom, which has not yet been written, of each sub-irradiation region 29.

In FIG. 16B, while the tracking control is performed by the main deflection X, each beam irradiates, as the shot 5, the pixel in the second column from the left and the second row from the bottom of the sub-irradiation region 29 concerned in the irradiation region 34 of the multiple beams 20.

While the tracking control is continuously performed, the sub deflector 209 shifts the irradiation position of each beam to the fourth column from the left and the second row from the bottom in the sub-irradiation region 29 concerned by the sub deflections X and Y.

In FIG. 15B, while the tracking control is performed by the main deflection X, each beam irradiates, as the shot 6, the pixel in the fourth column from the left and the second row from the bottom of the sub-irradiation region 29 concerned in the irradiation region 34 of the multiple beams 20.

While the tracking control is continuously performed, the sub deflector 209 shifts the irradiation position of each beam to the fourth column from the left and the fourth row from the bottom in the sub-irradiation region 29 concerned by the sub deflections X and Y.

While the tracking control is performed by the main deflection X, each beam irradiates, as the shot 7 (not shown), the pixel in the fourth column from the left and the fourth row from the bottom of the sub-irradiation region 29 concerned in the irradiation region 34 of the multiple beams 20.

While the tracking control is continuously performed, the sub deflector 209 shifts the irradiation position of each beam to the second column from the left and the fourth row from the bottom in the sub-irradiation region 29 concerned by the sub deflections X and Y.

In FIG. 16C, while the tracking control is performed by the main deflection X, each beam irradiates, as the shot 4, the pixel in the second column from the left and the fourth row from the bottom of the sub-irradiation region 29 concerned in the irradiation region 34 of the multiple beams 20.

As described above, in the sub-irradiation region 29 of 4×4 pixels, the same state as that of the shot 2 shown in FIG. 10B can be obtained by performing, during the second tracking control, four shots while shifting the sub deflection position in the sub-irradiation region 29.

In the main deflection shift (Y deflection) step (S114), in accordance with the tracking reset after the shot 8, the main deflector 208 performs a deflection (Y deflection: main deflection Y) so that the irradiation region 34 of the multiple beams 20 may be shifted in the y direction by a set extension width. In the example of FIG. 16C, the irradiation region 34 of the multiple beams 20 is shifted in the y direction by two pixels as the extension width.

In the sub-irradiation region 29 of 4×4 pixels, in the state where the irradiation region 34 of the multiple beams 20 has been deflected in the y direction by the extension width by the Y deflection, the same state as that of the shot 3 shown in FIG. 10C can be obtained by performing, during the third tracking control (not shown), four shots (shots 9 to 12) of the pixels in the second column from the left and the first row from the bottom, in the fourth column and the third row, in the fourth column and the first row, and in the second column and the third row while shifting the sub deflection position in the sub-irradiation region 29.

Further, in the sub-irradiation region 29 of 4×4 pixels, in the state where the irradiation region 34 of the multiple beams 20 has been deflected in the y direction by the extension width by the Y deflection, the same state as that of the shot 4 shown in FIG. 10D can be obtained by performing, during the fourth tracking control (not shown), four shots (shots 13 to 16) of the pixels in the first column from the left and the second row from the bottom, in the third column and the second row, in the third column and the fourth row, and in the first column and the fourth row while shifting the sub deflection position in the sub-irradiation region 29.

When the maximum irradiation time of the shot 16 has passed, the tracking control is reset. During the tracking cycles of the shots 13 to 16, the XY stage 105 has moved the distance L being two pixels. Therefore, by the tracking reset, the irradiation region 34 is moved in the x direction by two pixels.

In the main deflection shift reset (Y deflection reset) step (S118), in accordance with the tracking reset after the shot 16, the state where the irradiation region 34 of the multiple beams 20 has been deflected in the y direction by the extension width by the Y deflection is reset (Y deflection reset). In the Y deflection reset, the main deflector 208 performs a deflection so that the irradiation region 34 of the multiple beams 20 may be shifted in the −y direction by the extension width.

By repeating the operations of the shots 1 to 16 described above, the same writing as the examples of FIGS. 10A to 10D and FIGS. 11A to 11C can be performed.

After completing writing of the k-th stripe region 32, in the position displacement step (S122), the XY stage 105 is moved so that the irradiation region 34 of the multiple beams 20 may be located at the (k+1)th stripe region 32 which has been shifted in the y direction from the k-th stripe region 32 by a displacement amount different from the width size (extension width) in the y direction of the extended region 37 in a manner such that a part of the (k+1)th stripe region 32 is overlapped with the k-th stripe region 32.

Writing of the (k+1)th stripe region 32 is similarly performed to that of the k-th stripe region 32.

As described above, by performing writing in order from the first stripe region 32, in which the stripe region 32 of the first stripe layer and the stripe region 32 of the second stripe layer are alternately arranged, to the n-th stripe region 32 (k=1 to k=n), multiple writing of the writing region 30 of the target object 101 is performed with an exposure of the multiple beams 20 while shifting the stripe region by a set displacement amount.

Figure 17:
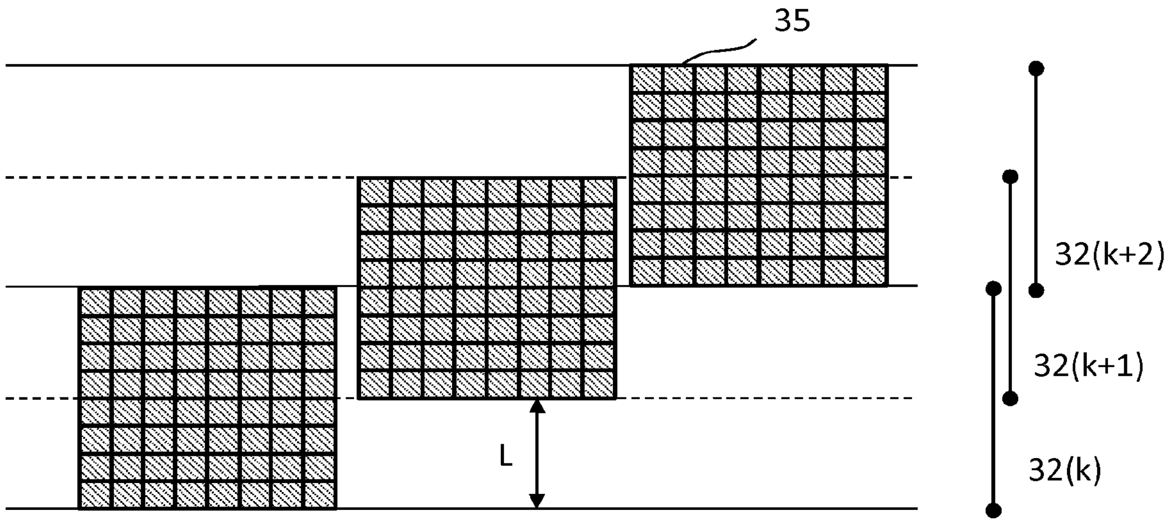
FIG. 17 is a diagram showing an example of pixels written in three stripe regions which are written in order according to a comparative example of the first embodiment.

FIG. 17 is a diagram showing an example of pixels written in three stripe regions which are written in order according to a comparative example of the first embodiment. FIG. 17 shows pixels written in a rectangular region 35 which is the same size as the irradiation region 34 used when writing the k-th stripe region 32. FIG. 17 also shows pixels written in the rectangular region 35 which is the same size as the irradiation region 34 used when writing the (k+1)th stripe region 32 displaced by the displacement amount L. FIG. 17 further also shows pixels written in the rectangular region 35 which is the same size as the irradiation region 34 used when writing the (k+2)th stripe region 32 displaced by the displacement amount L. In the case of FIG. 17, ½ of the width size of the stripe region is used as the displacement amount L. In the example of FIG. 17, in order to make the figure easily visible, the rectangular regions 35 of respective stripe regions are individually shifted in the x direction so that they may not overlap with each other, but actually, their x-direction positions indicate the same position in the rectangular region 35. Multiple writing is performed twice in each pixel in the upper half of the rectangular region 35 of the k-th stripe region 32 by writing the lower half of the rectangular region 35 of the (k+1)th stripe region 32 whose irradiation region 34 has been shifted in the y direction. Similarly, multiple writing is performed twice in each pixel in the upper half of the rectangular region 35 of the (k+1)th stripe region 32 by writing the lower half of the rectangular region 35 of the (k+2)th stripe region 32 whose irradiation region 34 has been shifted in the y direction. Also, multiple writing is performed twice in the lower half of the rectangular region 35 of the k-th stripe region 32 by writing the upper half of the rectangular region of the (k−1)th stripe region 32 (not shown). Further, multiple writing is performed twice in the upper half of the rectangular region 35 of the (k+2)th stripe region 32 by writing the lower half of the rectangular region 35 of the (k+3)th stripe region 32 (not shown). As described above, according to the comparative example, multiple writing is performed twice in every pixel by writing the irradiation region 34 having been displaced in the y direction. Thus, as shown in FIG. 7C, the positional deviation error in the y direction can be reduced to ½ by averaging the two-time writing.

Figure 18:
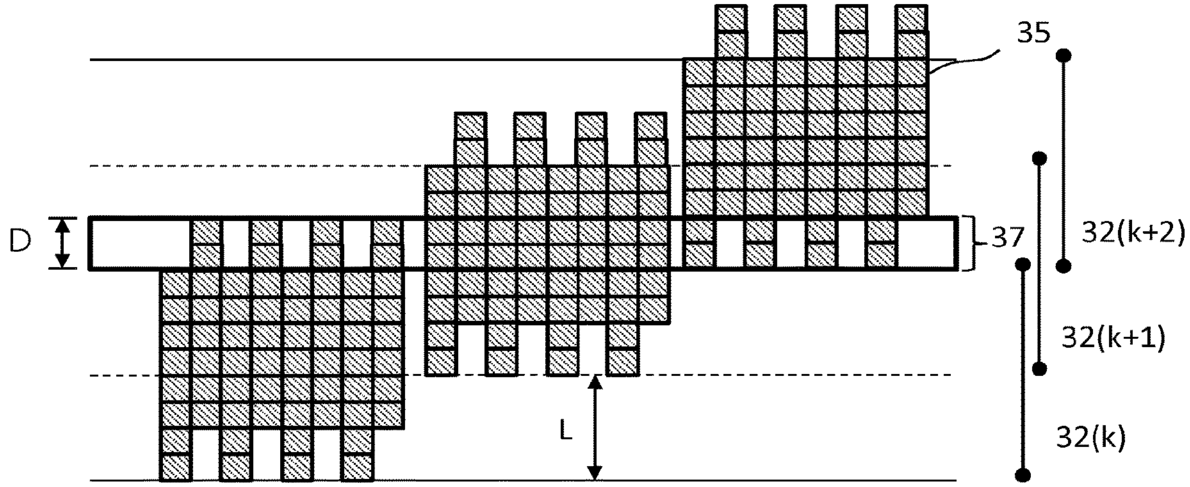
FIG. 18 is a diagram showing an example of pixels written in three stripe regions which are written in order according to the first embodiment.

FIG. 18 is a diagram showing an example of pixels written in three stripe regions which are written in order according to the first embodiment. FIG. 18 shows pixels written in the rectangular region 35 which is the same size as the irradiation region 34 used when writing the k-th stripe region 32, and pixels written in the extended region 37 of the k-th stripe region 32. FIG. 18 also shows pixels written in the rectangular region 35 which is the same size as the irradiation region 34 used when writing the (k+1)th stripe region 32, and pixels written in the extended region 37 of the (k+1)th stripe region 32. FIG. 18 further also shows pixels written in the rectangular region 35 which is the same size as the irradiation region 34 used when writing the (k+2)th stripe region 32, and pixels written in the extended region 37 of the (k+2)th stripe region 32. In the example of FIG. 18, in order to make the figure easily visible, the rectangular regions 35 of respective stripe regions are individually shifted in the x direction so that they may not overlap with each other, but actually, their x-direction positions indicate the same position in the rectangular region 35.

The irradiation positions of the multiple beams are controlled so that the pixel written in the extended region 37 of the k-th stripe region 32 at the same time of writing the k-th stripe region 32 may not overlap with the pixel written in the stripe region 32 adjacent and not overlapped with the k-th stripe region 32, (in the example of FIG. 18, the (k+2)th stripe region 32). In other words, the irradiation positions of the multiple beams 20 are controlled so that the pixel written in the k-th extended region 37 during writing the k-th stripe region 32 may not overlap with the pixel written in the (k+n)th (n being an integer of 2 or more) stripe region which is overlapped with the k-th extended region. When the displacement amount L of the multiple writing is ½ of the width of the stripe region 32, pixels remain without being written in the extended region 37 of the k-th stripe region 32 are to be written when writing the (k+2)th, adjacent but one, stripe region 32. The stripe region 32, where pixels remain without being written in the extended region 37 of the k-th stripe region 32, changes according to the displacement amount L of the multiple writing. For example, when the displacement amount L of the multiple writing is set to be ¼ of the width of the stripe region 32, pixels which remain without being written in the extended region 37 of the k-th stripe region 32 are to be written when writing the (k+4)th, adjacent but three, stripe region 32.

Multiple writing is performed twice in a part of pixels in the upper half of the rectangular region 35 of the k-th stripe region 32 by writing the lower half of the rectangular region 35 of the (k+1)th stripe region 32 whose irradiation region 34 has been shifted in the y direction. Further, an adjacent pixel (e.g., a pixel adjacent in the x direction) of a part of pixels in the upper half of the rectangular region 35 of the k-th stripe region 32 is written in the state where the irradiation region 34 has been displaced in the y direction by the Y deflection. Similarly, an adjacent pixel (e.g., pixel adjacent in the x direction) of a part of pixels in the lower half of the rectangular region 35 of the (k+1)th stripe region 32 is written in the state where the irradiation region 34 has been displaced in the y direction by the Y deflection. Although there exists a part of pixels in the lower half of the rectangular region 35 of the (k+1)th stripe region 32 that is not written due to the Y deflection, such pixels are written when writing the extended region 37 of the (k−1)th stripe region 32 (not shown). Therefore, pixels in the upper half of the rectangular region 35 of the k-th stripe region 32 are a combination of pixels in which multiple writing is performed twice by performing writing in the irradiation regions 34 shifted twice in the y direction and adjacent pixels written in the irradiation regions 34 shifted twice in the y direction. Therefore, an effect equivalent to averaging of four-time writing can be obtained.

Similarly, multiple writing is performed twice in a part of pixels in the upper half of the rectangular region 35 of the (k+1)th stripe region 32 by writing the lower half of the rectangular region 35 of the (k+2)th stripe region 32 whose irradiation region 34 has been shifted in the y direction. Further, an adjacent pixel (e.g., a pixel adjacent in the x direction) of a part of pixels in the upper half of the rectangular region 35 of the (k+1)th stripe region 32 is written in the state where the irradiation region 34 has been displaced in the y direction by the Y deflection. Similarly, an adjacent pixel (e.g., pixel adjacent in the x direction) of a part of pixels in the lower half of the rectangular region 35 of the (k+2)th stripe region 32 is written in the state where the irradiation region 34 has been displaced in the y direction by the Y deflection. Therefore, pixels in the upper half of the rectangular region 35 of the (k+1)th stripe region 32 are a combination of pixels in which multiple writing is performed twice by performing writing in the irradiation regions 34 shifted twice in the y direction and adjacent pixels written in the irradiation regions 34 shifted twice in the y direction. Therefore, an effect equivalent to averaging of four-time writing can be obtained.

Figures 19A, 19B, 19C:
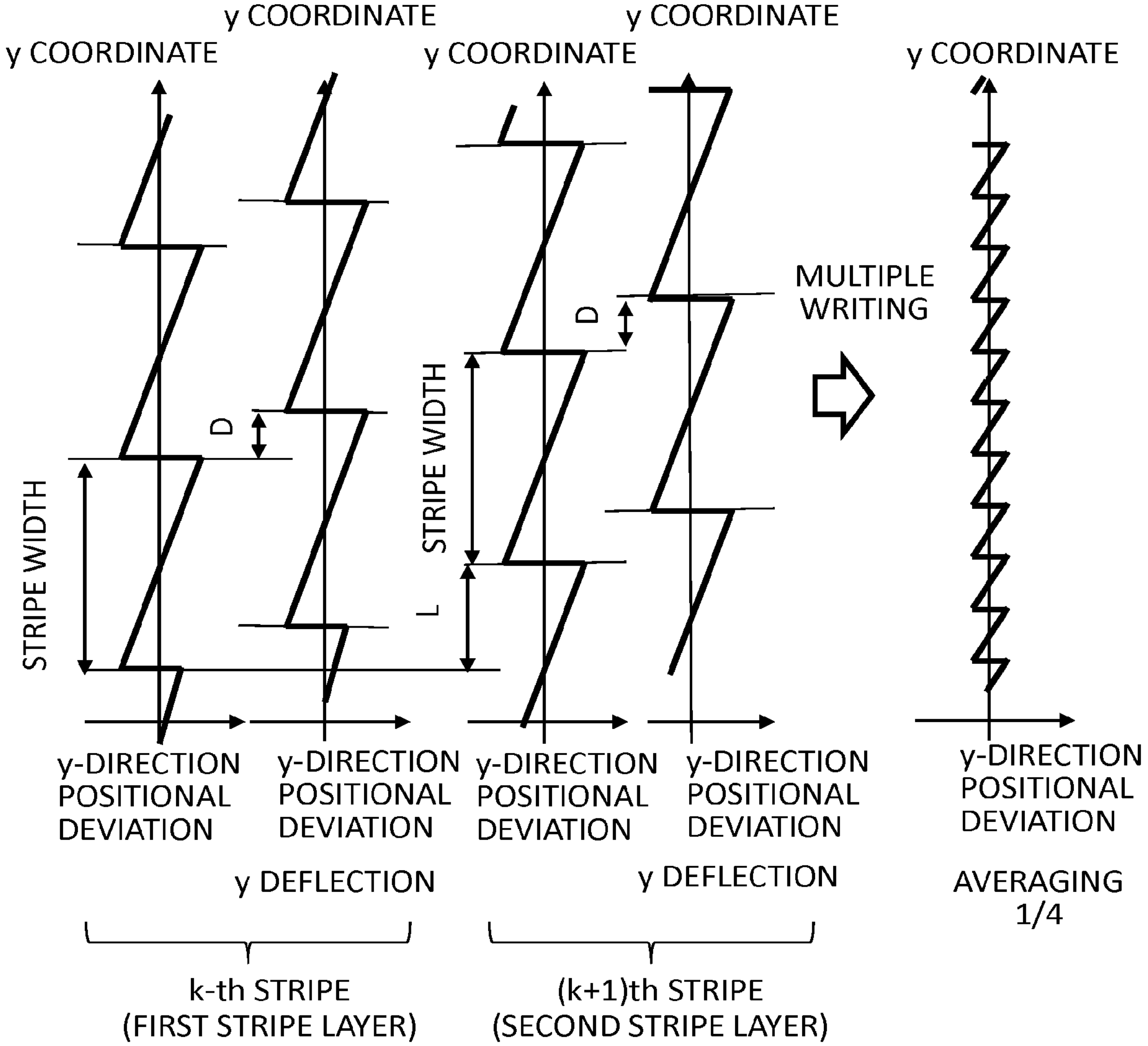
FIGS. 19A to 19C are diagrams for explaining an example of averaging a y-direction positional deviation amount according to the first embodiment.

FIGS. 19A to 19C are diagrams for explaining an example of averaging a y-direction positional deviation amount according to the first embodiment. FIGS. 19A to 19C show the case where multiple writing is performed with the multiple beams 20 of the beam array shape whose linear component YY has been displaced, for example. In the case of the beam array shape in which a positional deviation occurs extending in the y direction beyond the design shape, no positional deviation occurs as described above at the center in the y direction among positions in the beam array shape. In contrast, at the y direction end, a positive positional deviation occurs. At the −y direction end, a negative, being a reversed sign, positional deviation occurs whose amount is the same as that of the positive positional deviation. When performing multiple writing with a positional deviation amount L of ½ of the width of the stripe region 32 while executing a Y deflection by an extension width D during writing each stripe region 32, averaging is achieved by combining a positional deviation amount due to writing (first pass of multiple writing) of the first stripe layer shown in FIG. 19A, a positional deviation amount due to writing the first stripe layer in the state where the position of the irradiation region 34 has been displaced in the y direction by the Y deflection, a positional deviation amount due to writing (second pass of multiple writing) of the second stripe layer shown in FIG. 19B, and a positional deviation amount due to writing the second stripe layer in the state where the position of the irradiation region 34 has been displaced in the y direction by the Y deflection. By setting the displacement amount L of multiple writing to be different from the extension width D of the Y deflection, averaging of four-time writing can be achieved as shown in FIG. 19C. Therefore, the absolute value of the positional deviation amount can be smaller than that of FIG. 7C. Furthermore, by setting the extension width D to be ½ of the displacement amount L, the absolute value of the positional deviation amount obtained by averaging four-time writing can be reduced to ¼.

Figure 20A:
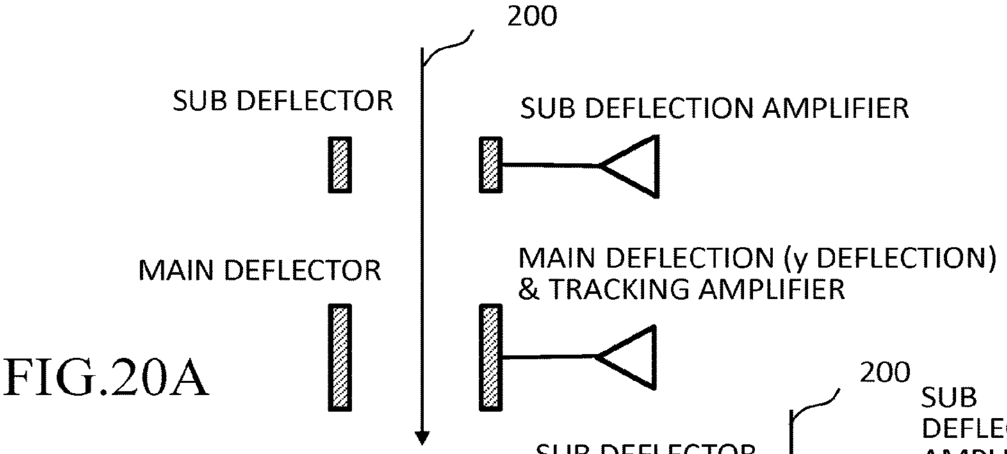
FIGS. 20A to 20C are diagrams explaining a configuration of a deflector according to the first embodiment.
Figure 20B:
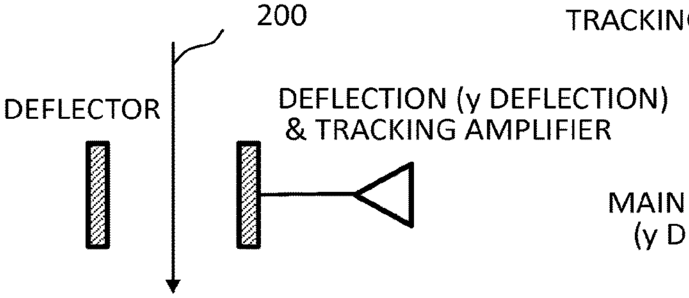
Figure 20C:
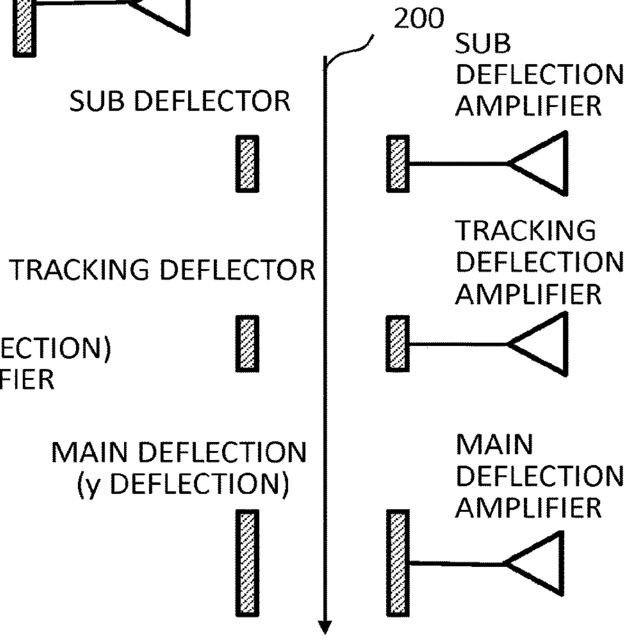

FIGS. 20A to 20C are diagrams explaining a configuration of a deflector according to the first embodiment. In the case of FIG. 1, the multiple beams 20 are deflected by a two-stage deflection of the main and sub deflectors as shown in FIG. 20A. An electric potential is individually applied to each electrode of the main deflector 208 from the main deflection amplifier (DAC amplifier 134). Similarly, a potential is individually applied to each electrode of the sub deflector 209 from the sub deflection amplifier (DAC amplifier 132). As described above, the main deflector 208 performs an x-direction tracking control (main deflection X) and a y-direction Y deflection control (main deflection Y). The sub deflector 209 performs an x-direction deflection control (sub deflection X) of the irradiation positions (the lower left, the upper right, the lower right, and the upper left of 2×2 pixels) of respective beams in the sub-irradiation region 29, and a y-direction deflection control (sub deflection Y) of the irradiation positions (the lower left, the upper right, the lower right, and the upper left of 2×2 pixels) of respective beams in the sub-irradiation region 29.

The configuration of the deflector is not limited to what is described above. For example, as shown in FIG. 20B, all the deflection controls may be performed by a one-stage deflector. Thus, the one-stage deflector performs an x-direction tracking control (main deflection X), a y-direction Y deflection control (main deflection Y), an x-direction deflection control (sub deflection X) of the irradiation positions (the lower left, the upper right, the lower right, and the upper left of 2×2 pixels) of respective beams in the sub-irradiation region 29, and a y-direction deflection control (sub deflection Y) of the irradiation positions (the lower left, the upper right, the lower right, and the upper left of 2×2 pixels) of respective beams in the sub-irradiation region 29. An electric potential is individually applied to each electrode of the deflector shown in FIG. 20B from the deflection amplifier.

Alternatively, a three-stage deflector may be used for configure the deflector as shown in FIG. 20C. For example, a sub deflector, a tracking deflector, and a main deflector are arranged in order from the upstream side of the trajectory of the multiple beams 20. An electric potential is individually applied to each electrode of the main deflector from the main deflection amplifier. A potential is individually applied to each electrode of the tracking deflector from the tracking deflection amplifier. A potential is individually applied to each electrode of the sub deflector from the sub deflection amplifier. The main deflector performs a y-direction Y deflection control (main deflection Y). The tracking deflector performs an x-direction tracking control (main deflection X). The sub deflector 209 performs an x-direction deflection control (sub deflection X) of the irradiation positions (the lower left, the upper right, the lower right, and the upper left of 2×2 pixels) of respective beams in the sub-irradiation region 29, and a y-direction deflection control (sub deflection Y) of the irradiation positions (the lower left, the upper right, the lower right, and the upper left of 2×2 pixels) of respective beams in the sub-irradiation region 29.

As described above, according to the first embodiment, it is possible to further reduce a positional deviation due to displacement of the linear component of the beam array shape in multiple beam writing compared with a reduction by an averaging effect based on the number of passes of multiple writing.

Embodiments have been explained referring to specific examples described above. However, the present invention is not limited to these specific examples.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any multiple charged particle beam writing apparatus and multiple charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam writing method comprising:

performing writing in each stripe region, which is obtained by dividing a writing region on a surface of a target object by a predetermined size width in a first direction, while deflecting multiple charged particle beams within an irradiation region of the multiple charged particle beams, a design region width in the first direction of the irradiation region being the predetermined size, and moving the irradiation region in a second direction orthogonal to the first direction;

performing writing, during writing in a k-th (k being an integer of at least one) stripe region, in a k-th extended region, which is obtained by extending the irradiation region in the first direction by a predetermined extension width, while deflecting the multiple charged particle beams and moving the multiple charged particle beams in the second direction;

performing writing in a (k+1)th stripe region which has been shifted in the first direction from the k-th stripe region by a displacement amount different from the extension width in a manner such that a part of the (k+1)th stripe region is overlapped with the k-th stripe region; and performing writing, during writing in the (k+1)th stripe region, in a (k+1)th extended region, which is obtained by extending the irradiation region in the first direction by the extension width, while deflecting the multiple charged particle beams and moving the multiple charged particle beams in the second direction.

2. The method according to claim 1, wherein the target object is placed on a stage, during writing in the k-th stripe region, the stage is moved in a direction opposite to the second direction and a tracking control is performed so that the irradiation region follows a movement of the stage, and a deflection for shifting the irradiation region in order to extend the irradiation region is performed at a time of a tracking reset which resets the tracking control.

3. The method according to claim 1, wherein an inside of each of a sub-irradiation region surrounded with a beam pitch size, on the surface of the target object, of the multiple charged particle beams in each of the stripe region is composed of a combination of a pixel written in a state where the irradiation region concerned has not been deflected to be shifted, and a pixel written in a state where the irradiation region concerned has been deflected to be shifted.

4. The method according to claim 1, wherein the extension width is set to be ½ of the displacement amount.

5. The method according to claim 1, wherein multiple writing is performed in the writing region with an exposure of the multiple charged particle beams while shifting the stripe region by the displacement amount, and irradiation positions of the multiple charged particle beams are controlled so that a pixel written in the k-th extended region during writing the k-th stripe region does not overlap with a pixel written in a (k+n)th (n being an integer of at least two) stripe region which is overlapped with the k-th extended region.

6. The method according to claim 1, wherein at a time of writing the k-th extended region, the irradiation region is moved in the first direction by deflecting the multiple charged particle beams so that the k-th extended region is included in the irradiation region.

7. The method according to claim 6, wherein the target object is placed on a stage, during writing in the k-th stripe region, the stage is moved in a direction opposite to the second direction and a tracking control is performed so that the irradiation region follows a movement of the stage, and moving the irradiation region in the first direction during writing in the k-th stripe region is performed at a time of a tracking reset which resets the tracking control.

8. The method according to claim 7, wherein resetting the moving of the irradiation region, which has been moved in the first direction, during writing in the k-th stripe region is performed at the time of the tracking reset of resetting the tracking control.

9. The method according to claim 1, wherein an inside of each of a sub-irradiation region surrounded with a beam pitch size on the surface of the target object of the multiple charged particle beams in the k-th stripe region is composed of a combination of a pixel written in a state where the k-th extended region is not written, and a pixel written while the k-th extended region is written.

10. A multiple charged particle beam writing apparatus comprising:

a writing mechanism configured to include a stage on which a target object is placed and a deflector which deflects multiple charged particle beams, and to write a pattern on the target object with the multiple charged particle beams; and a writing control circuit configured to control a writing operation by the writing mechanism, wherein the writing control circuit controls to perform writing in each stripe region, which is obtained by dividing a writing region on a surface of the target object by a predetermined size width in a first direction, while deflecting the multiple charged particle beams within an irradiation region of the multiple charged particle beams, a design region width in the first direction of the irradiation region being a predetermined size, and moving the irradiation region in a second direction orthogonal to the first direction, controls to perform writing, during writing in a k-th (k being an integer of at least one) stripe region, in a k-th extended region, which is obtained by extending the irradiation region in the first direction by the predetermined extension width, while deflecting the multiple charged particle beams and moving the multiple charged particle beams in the second direction, controls to perform writing in a (k+1)th stripe region which has been shifted in the first direction from the k-th stripe region by a displacement amount different from the extension width in a manner such that a part of the (k+1)th stripe region is overlapped with the k-th stripe region, and controls to perform writing, during writing in the (k+1)th stripe region, in a (k+1)th extended region, which is obtained by extending the irradiation region in the first direction by the extension width, while deflecting the multiple charged particle beams and moving the multiple charged particle beams in the second direction.

* * * * *